(12) United States Patent
Cha et al.

(10) Patent No.: US 12,048,196 B2
(45) Date of Patent: Jul. 23, 2024

(54) DISPLAY PANEL AND ELECTRONIC APPARATUS INCLUDING THE SAME

(71) Applicant: Samsung Display Co., Ltd., Yongin-Si (KR)

(72) Inventors: Myounggeun Cha, Yongin-si (KR); Sanggun Choi, Yongin-si (KR); Jiyeong Shin, Yongin-si (KR); Kiseok Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 194 days.

(21) Appl. No.: 17/565,146

(22) Filed: Dec. 29, 2021

(65) Prior Publication Data

US 2022/0399407 A1 Dec. 15, 2022

(30) Foreign Application Priority Data

Jun. 9, 2021 (KR) .................. 10-2021-0074974

(51) Int. Cl.
*H10K 59/121* (2023.01)
*H10K 59/124* (2023.01)
*H10K 59/126* (2023.01)
*H10K 59/65* (2023.01)
*H10K 77/10* (2023.01)
*H01L 27/12* (2006.01)
(Continued)

(52) U.S. Cl.
CPC ....... *H10K 59/121* (2023.02); *H10K 59/1213* (2023.02); *H10K 59/124* (2023.02); *H10K 59/126* (2023.02); *H10K 59/65* (2023.02); *H10K 77/111* (2023.02); *H01L 27/1222* (2013.01); *H01L 29/78633* (2013.01); *H01L 29/78675* (2013.01); *H10K 2102/311* (2023.02)

(58) Field of Classification Search
CPC .......................... H10K 59/126; H10K 59/121
See application file for complete search history.

(56) References Cited

U.S. PATENT DOCUMENTS 8,610,124 B2 12/2013 Ro et al.
2018/0026152 A1 1/2018 Benson et al.
(Continued)

FOREIGN PATENT DOCUMENTS

CN 110867476 A 3/2020
KR 10-0646962 B1 11/2006
(Continued)

*Primary Examiner* — Douglas M Menz
(74) *Attorney, Agent, or Firm* — Innovation Counsel LLP

(57) ABSTRACT

Provided are a display panel and an electronic apparatus including the display panel. The display panel includes a substrate including a polymer resin; first and second pixel circuits each including a thin-film transistor, a first light-emitting diode connected to the first pixel circuit and located in a first display area; a second light-emitting diode connected to the second pixel circuit and located in a sub-display area of a second display area, a bottom metal layer in the second display area and between the substrate and the second pixel circuit; and a protective layer between the substrate and the bottom metal layer and corresponding to the first and second display areas, wherein the bottom metal layer includes a first opening in a transmissive area, and the protective layer includes a second opening in the transmissive area and overlapping the first opening of the bottom metal layer.

28 Claims, 13 Drawing Sheets

(51) Int. Cl.
*H01L 29/786* (2006.01)
*H10K 102/00* (2023.01)

(56) References Cited

U.S. PATENT DOCUMENTS

| | | |
|---|---|---|
| 2019/0081273 A1 | 3/2019 | Sung et al. |
| 2020/0036566 A1 | 1/2020 | Moroga et al. |
| 2020/0273927 A1 | 8/2020 | Oh et al. |
| 2020/0365674 A1 | 11/2020 | Jeon et al. |
| 2021/0151530 A1 | 5/2021 | Park et al. |
| 2021/0159286 A1 | 5/2021 | Ma et al. |
| 2021/0280825 A1* | 9/2021 | Beon ............... H10K 59/65 |
| 2021/0391400 A1* | 12/2021 | Kim ............... H10K 59/126 |

FOREIGN PATENT DOCUMENTS

| | | |
|---|---|---|
| KR | 10-2011-0111708 A | 10/2011 |
| KR | 10-2083315 B1 | 3/2020 |
| KR | 10-2020-0102580 A | 9/2020 |
| KR | 10-2020-0131397 A | 11/2020 |
| KR | 10-2020-0131400 A | 11/2020 |
| KR | 10-2021-0060738 A | 5/2021 |

* cited by examiner

DISPLAY PANEL AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0074974, filed on Jun. 9, 2021, in the Korean Intellectual Property Office, the disclosure of which is incorporated by reference herein in its entirety.

BACKGROUND

1. Field

One or more embodiments relate to a display panel and an electronic apparatus including the display panel. More particularly, the present disclosure relates to a display panel and the electronic apparatus including a component area in the display panel for providing the component (such as camera, sensor, etc.) under the display panel.

2. Description of the Related Art

Recently, the usage of display panels has diversified. In addition, as display panels have become thinner and lighter, their range of use has gradually been extended.

As the area occupied by a display area in display panels has expanded, various functions combined with or linked to display panels have been added. As a way to add various functions while increasing an area, research into a display panel having an area for providing other various functions than an image display in a display area has been conducted.

SUMMARY

Components such as a camera or a sensor may be arranged in a display panel to provide various functions. To arrange components while ensuring a large display area, the components may be arranged to overlap a display area. As a method of arranging components, a display panel may include a transmissive area through which a wavelength such as light or sound may pass. The present disclosure includes a display panel having the above structure and an electronic apparatus including the display panel.

Additional aspects will be set forth in part in the description which follows and, in part, will be apparent from the description, or may be learned by practice of the presented embodiments of the present disclosure.

According to an embodiment, a display panel includes a substrate including a polymer resin, a first pixel circuit and a second pixel circuit arranged on the substrate and each including a thin-film transistor, a first light-emitting diode electrically connected to the first pixel circuit and located in a first display area, a second light-emitting diode electrically connected to the second pixel circuit and located in a sub-display area of a second display area, a bottom metal layer located in the second display area and disposed between the substrate and the second pixel circuit, and a protective layer corresponding to the first display area and the second display area, the protective layer disposed between the substrate and the bottom metal layer, wherein the bottom metal layer includes a first opening in a transmissive area that is adjacent to the sub-display area of the second display area, and the protective layer includes a second opening located in the transmissive area and overlapping the first opening of the bottom metal layer.

A width of the second opening of the protective layer may be less than a width of the first opening of the bottom metal layer.

The protective layer may include amorphous silicon, a silicon (Si)-rich silicon oxynitride, or a multi-layer structure of silicon oxide and silicon nitride.

The thin-film transistor of each of the first pixel circuit and the second pixel circuit may include a semiconductor layer including polysilicon.

The second pixel circuit may include a plurality of thin-film transistors, and the bottom metal layer may overlap the plurality of thin-film transistors.

The display panel may further include an additional metal layer between the substrate and the first pixel circuit, and the additional metal layer may overlap one or some of a plurality of thin-film transistors of the first pixel circuit.

A thickness of the additional metal layer may be less than a thickness of the bottom metal layer.

The display panel may further include an interlayer insulating layer between the additional metal layer and the bottom metal layer.

The display panel may further include a stacked body of inorganic insulating layers arranged on the substrate and arranged below the first light-emitting diode and the second light-emitting diode, wherein the stacked body includes a third opening located in the transmissive area and overlapping the first opening of the bottom metal layer and the second opening of the protective layer.

The display panel may further include an organic insulating layer arranged on the stacked body and arranged below the first light-emitting diode and the second light-emitting diode, and a portion of the organic insulating layer may be in the third opening of the stacked body.

A portion of the organic insulating layer may be in the second opening of the protective layer.

A portion of the organic insulating layer may come into contact with the substrate through the second opening of the protective layer and the third opening of the stacked body.

The substrate may include a first base layer including a polymer resin, a first barrier layer arranged on the first base layer and including an inorganic insulating material, a second base layer arranged on the first base layer and including a polymer resin, and a second barrier layer arranged on the second base layer and including an inorganic insulating material, and the portion of the organic insulating layer may come into contact with the second barrier layer.

According to an embodiment, an electronic apparatus includes a display panel including a first area and a second area at least partially surrounded by the first area, the second area including a sub-display area and a transmissive area, and a component arranged below the display panel to be located in the second display area, wherein the display panel further includes a substrate, a first light-emitting diode arranged in the first display area and electrically connected to a first pixel circuit arranged on the substrate, the first pixel circuit including a thin-film transistor, a second light-emitting diode arranged in the sub-display area of the second display area and electrically connected to a second pixel circuit arranged on the substrate, the second pixel circuit including a thin-film transistor, a bottom metal layer disposed between the substrate and the second pixel circuit in the second display area, and including a first opening located in the transmission area, and a protective layer disposed between the substrate and the bottom metal layer and including a second opening overlapping the first opening of the bottom metal layer.

The display panel may further include a stacked body of inorganic insulating materials arranged on the bottom metal layer, and the stacked body may include a third opening overlapping the first opening of the bottom metal layer and the second opening of the protective layer.

The display panel may further include an organic insulating layer arranged on the stacked body and arranged below the first light-emitting diode and the second light-emitting diode, and a portion of the organic insulating layer may be in the third opening of the stacked body and the second opening of the protective layer.

The portion of the organic insulating layer may come into direct contact with the substrate through the third opening of the stacked body and the second opening of the protective layer.

The substrate may include a first base layer including a polymer resin, a first barrier layer arranged on the first base layer and including an inorganic insulating material, a second base layer arranged on the first base layer and including a polymer resin, and a second barrier layer arranged on the second base layer and including an inorganic insulating material, and the portion of the organic insulating layer may come into contact with the second barrier layer.

A width of the second opening of the protective layer may be less than a width of the first opening of the bottom metal layer.

The protective layer may include a material having a transmittance in a wavelength band of about 250 nm to about 350 nm, about 10% or less.

The protective layer may include amorphous silicon, a silicon (Si)-rich silicon oxynitride, or a multi-layer structure of silicon oxide and silicon nitride.

The thin-film transistor of each of the first pixel circuit and the second pixel circuit may include a semiconductor layer including polysilicon.

The second pixel circuit may include a plurality of thin-film transistors, and the bottom metal layer may overlap the plurality of thin-film transistors.

The display panel may further include an additional metal layer between the substrate and the first pixel circuit.

A thickness of the additional metal layer may be less than a thickness of the bottom metal layer.

The additional metal layer may overlap one or some of a plurality of thin-film transistors of the first pixel circuit.

The display panel may further include an interlayer insulating layer between the additional metal layer and the bottom metal layer.

The component may include a sensor or a camera.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments will be more apparent from the following description taken in conjunction with the accompanying drawings, in which:

FIGS. 2A and 2B are perspective views of a foldable electronic apparatus according to an embodiment, wherein FIG. 2A shows a folded state of the foldable electronic apparatus, and FIG. 2B shows an unfolded state of the foldable electronic apparatus;

DETAILED DESCRIPTION

Figure 1:
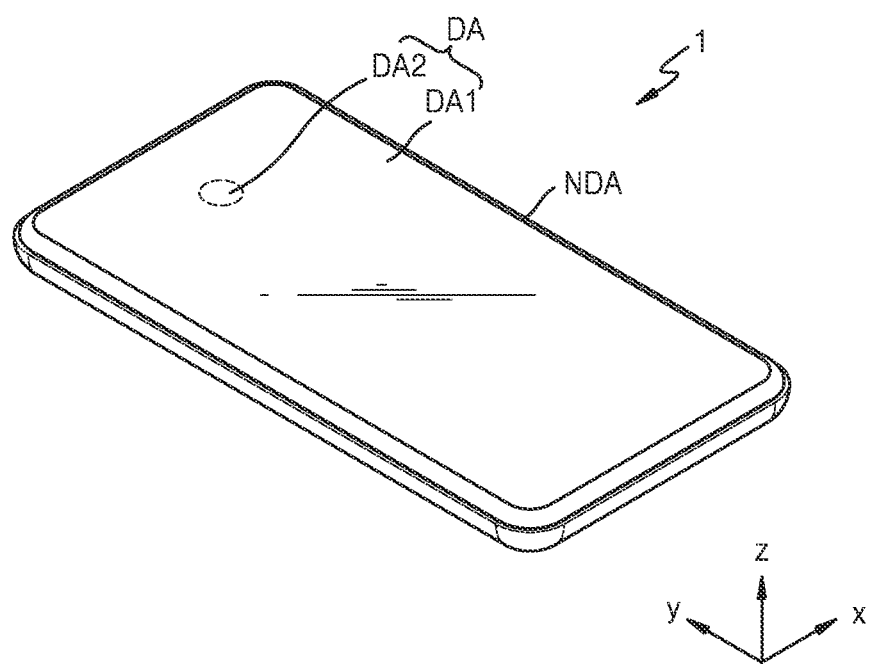
FIG. 1 is a perspective view illustrating an electronic apparatus according to an embodiment.

Reference will now be made in detail to embodiments, examples of which are illustrated in the accompanying drawings, wherein like reference numerals refer to like elements throughout the present disclosure. In this regard, the present embodiments may have different forms and configuration and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items.

Because the present disclosure may have diverse modified embodiments, embodiments are illustrated in the drawings and are described with respect to the embodiments. An effect and a characteristic of the present disclosure, and a method of accomplishing them will be apparent by referring to embodiments described with reference to the drawings. The present disclosure may, however, be embodied in many different forms and configurations and should not be construed as limited to the embodiments set forth herein.

One or more embodiments of the present disclosure will be described below in more detail with reference to the accompanying drawings. Components that are the same or are in correspondence with each other are rendered the same reference numeral regardless of the figure number, and redundant explanations are omitted.

In an embodiment below, terms such as "first" and "second" are used herein merely to describe a variety of constituent elements, but the constituent elements are not limited by the terms. Such terms are used only for the purpose of distinguishing one constituent element from another constituent element.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, area, or element is referred to as being "formed on" another layer, area, or element, it can be directly or indirectly formed on the other layer, region, or element. That is, for example, one or more intervening layers, areas, or elements may be present therebetween.

Throughout the present disclosure, the expression "at least one of a, b or c" indicates only a, only b, only c, both a and b, both a and c, both b and c, all of a, b, and c, or any variations thereof.

In the drawings, sizes of components in the drawings may be exaggerated or reduced for convenience of explanation. In other words, because sizes and thicknesses of components in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

FIG. 1 is a perspective view illustrating an electronic apparatus 1 according to an embodiment.

The electronic apparatus 1 according to an embodiment is an apparatus for displaying moving images or still images, and may be used as a display screen of various products including televisions (TVs), laptop computers, monitors, billboards, Internet of things (IoT) as well as portable electronic apparatuses including mobile phones, smartphones, tablet personal computers (PCs), mobile communication terminals, electronic organizers, electronic books, portable multimedia players (PMPs), navigations, and ultra mobile PCs (UMPCs). In addition, the electronic apparatus 1 according to an embodiment may be used in wearable devices, such as smart watches, watch phones, glasses-type displays, and head-mounted displays (HMDs). In addition, the electronic apparatus 1 according to an embodiment may be used as instrument panels for automobiles, center information displays (CIDs) arranged on center fascias or dashboards, room mirror displays that replace side-view mirrors of automobiles, and displays arranged on the rear side of front seats as entertainment for rear seats of automobiles. For convenience of description, FIG. 1 shows that the electronic apparatus 1 is used as a smartphone.

Referring to FIG. 1, the electronic apparatus 1 may include a display area DA and a non-display area NDA outside of the display area DA. The electronic apparatus 1 may provide an image through an array of a plurality of pixels arranged in a two-dimensional manner in the display area DA.

The non-display area NDA is an area in which no images are provided, and may entirely surround the display area DA. A driver, etc. for providing electric signals or power to display elements arranged in the display area DA may be arranged in the non-display area NDA. A pad, which is an area to which an electronic element or a printed circuit board may be electrically connected, may be arranged in the non-display area NDA.

The display area DA may include a first display area DA1 and a second display area DA2. The second display area DA2 is an area in which components for providing various functions to the electronic apparatus 1 are arranged, and the second display area DA2 may correspond to a component area.

Figure 2A:
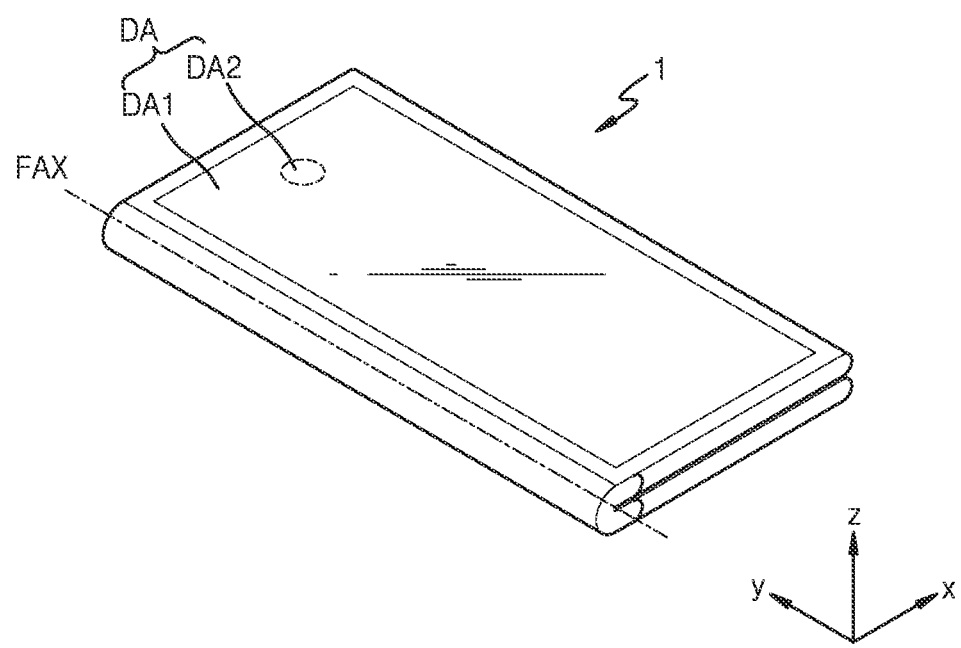
Figure 2B:
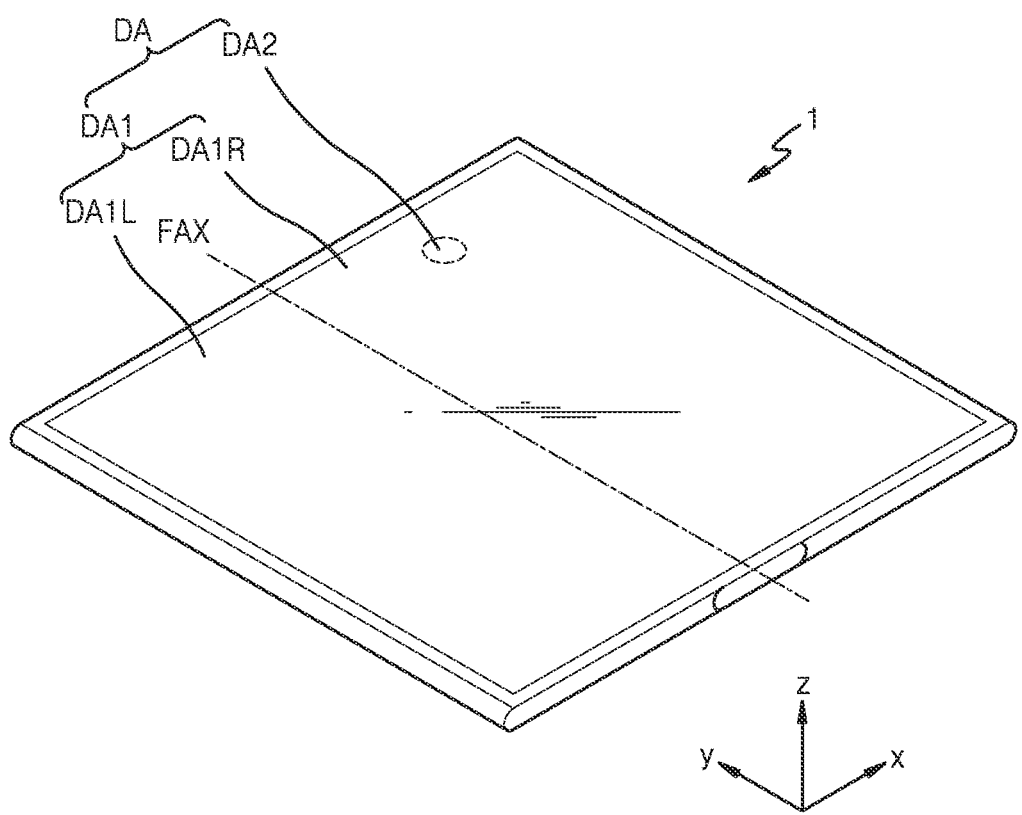

FIGS. 2A and 2B are perspective views of a foldable electronic apparatus according to an embodiment. FIG. 2A shows a folded state of the foldable electronic apparatus, and FIG. 2B shows an unfolded state of the foldable electronic apparatus.

The electronic apparatus 1 according to an embodiment may include a foldable electronic apparatus. The electronic apparatus 1 may be folded with respect to a folding axis FAX. The display area DA may be located outside and/or inside of the electronic apparatus 1. In an embodiment, each of FIGS. 2A and 2B respectively show the display area DA located outside and inside of the electronic apparatus 1.

Referring to FIG. 2A, the display area DA may be arranged outside of the electronic apparatus 1. An outer surface of the electronic apparatus 1 that is folded may include the display area DA, and the display area DA may include a first display area DA1 occupying the majority of the display area DA, and a second display area DA2 having a relatively smaller area than the first display area DA1.

Referring to FIG. 2B, the display area DA may be arranged inside of the electronic apparatus 1. An inner surface of the electronic apparatus 1 that is unfolded may include the display area DA, and the display area DA may include a first display area DA1 occupying the majority of the display area DA, and a second display area DA2 having a relatively smaller area than the first display area DA1.

FIG. 2B shows that the first display area DA1 includes a left display area DA1L and a right display area DA1R respectively arranged at opposite sides of the folding axis FAX, and the second display area DA2 is located inside of the right display area DA1R. However, the present disclosure is not limited thereto. In another embodiment, the second display area DA2 may be arranged inside of the left display area DA1L. In another embodiment, the second display area DA2 may be arranged inside of the left and right display areas DA1L and DA1R.

Figure 3:
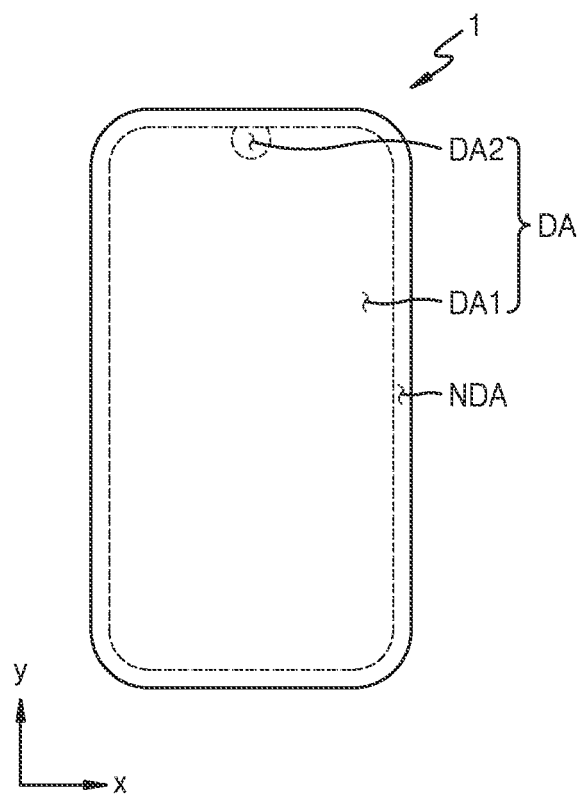
FIG. 3 is a plan view schematically illustrating an electronic apparatus according to an embodiment.

FIG. 3 is a plan view schematically illustrating an electronic apparatus 1 according to an embodiment.

In FIGS. 1, 2A, and 2B, the second display area DA2 of the electronic apparatus 1 is entirely surrounded by the first display area DA1, but the present disclosure is not limited thereto. As shown in FIG. 3, the second display area DA2 may be partially surrounded by the first display area DA1.

In FIGS. 1, 2A, 2B, and 3, the second display area DA2 is arranged above the display area DA, but the present disclosure is not limited thereto. In another embodiment, the second display area DA2 may be arranged at various positions of the display area DA while being at least partially surrounded by the first display area DA1.

Figure 4:
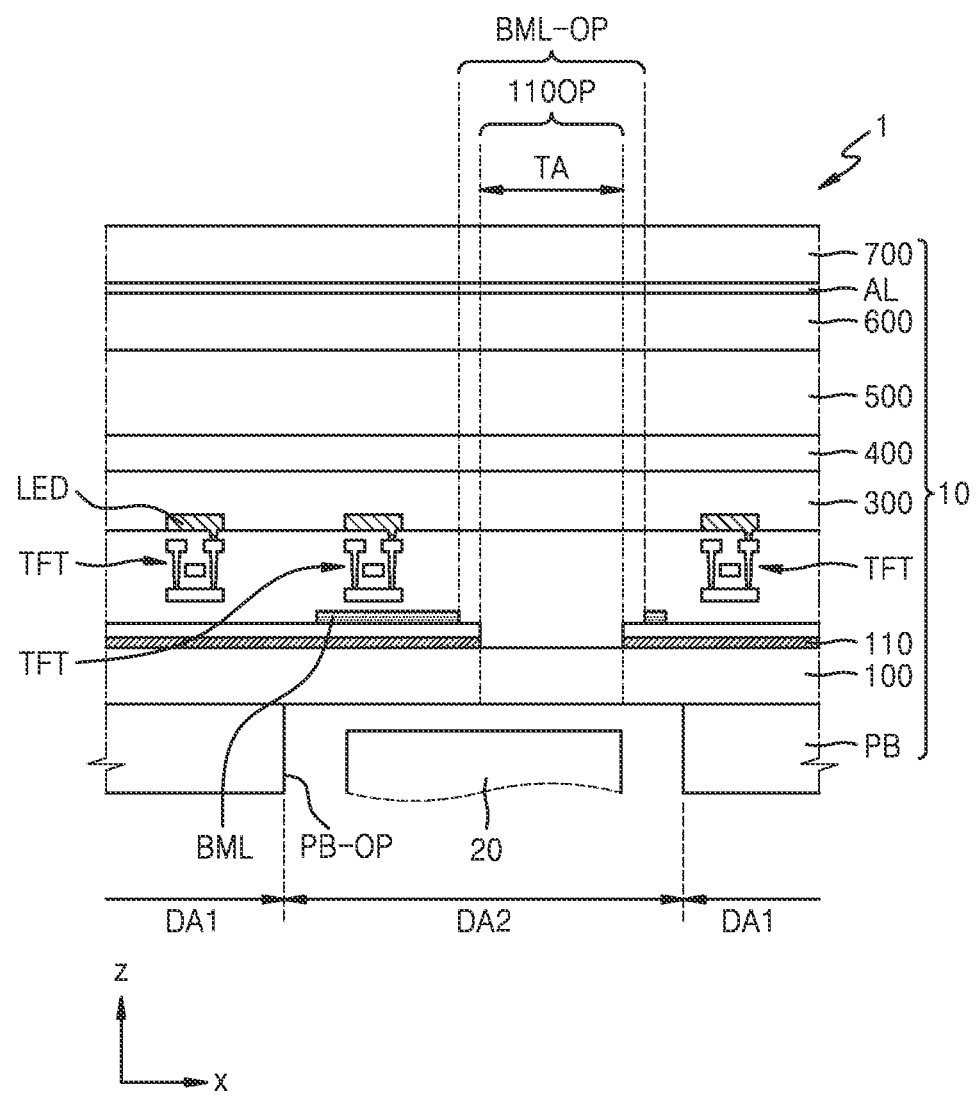
FIG. 4 is a cross-sectional view showing a portion of an electronic apparatus according to an embodiment.

FIG. 4 is a cross-sectional view showing a portion of an electronic apparatus 1 according to an embodiment.

Referring to FIG. 4, the electronic apparatus 1 may include a display panel 10 and a component 20 arranged on a lower surface of the display panel 10 to overlap the display panel 10. The component 20 may be arranged below the display panel 10, and may be arranged in the second display area DA2.

The display panel 10 may include a substrate 100, a thin-film transistor TFT arranged on the substrate 100, a display element (for example, a light-emitting diode LED) electrically connected to the thin-film transistor TFT, an encapsulation layer 300 covering the display element, an input detection layer 400, an anti-reflection layer 600, and a window 700.

The substrate 100 may include glass or a polymer resin. The substrate 100 including a polymer resin may be flexible, foldable, rollable, or bendable. The substrate 100 may have a multi-layer structure including a layer including the above-described polymer resin, and an inorganic layer (not shown).

A lower protective film PB may be arranged on the lower surface of the substrate 100. The lower protective film PB may be attached to the lower surface of the substrate 100. An adhesive layer may be between the lower protective film PB and the substrate 100. In some embodiments, the lower protective film PB may be directly provided on a rear surface of the substrate 100, and in this case, the adhesive layer may not be between the lower protective film PB and the substrate 100.

The lower protective film PB may support and protect the substrate 100. The lower protective film PB may have an opening PB-OP corresponding to the second display area DA2. The lower protective film PB may include an organic insulating material such as polyethylene terephthalate (PET) or polyimide (PI).

The thin-film transistor TFT and the light-emitting diode LED as a display element electrically connected to the thin-film transistor TFT may be arranged on an upper surface of the substrate 100. The light-emitting diode LED may include an organic light-emitting diode including an organic material. The organic light-emitting diode may emit red, green, or blue light.

The light-emitting diode LED may include an inorganic light-emitting diode including an inorganic material. The inorganic light-emitting diode may include a p-n junction diode including materials based on an inorganic semiconductor. When a voltage is applied to the p-n junction diode in a forward direction, holes and electrons are injected, and energy generated by recombination of the holes and electrons is converted into light energy to emit light of a color. The inorganic light-emitting diode described above may have a width of several to several hundred micrometers or several to several hundred nanometers. In some embodiments, the light-emitting diode LED may include a quantum dot light-emitting diode. An emission layer of the light-emitting diode LED may include an organic material, may include an inorganic material, may include quantum dots, may include an organic material and quantum dots, or may include an inorganic material and quantum dots.

The light-emitting diode LED may be electrically connected to the thin-film transistor TFT arranged therebelow. The thin-film transistor TFT and the light-emitting diode LED electrically connected to the thin-film transistor TFT may be arranged in each of the first display area DA1 and the second display area DA2.

A transmissive area TA may be located in the second display area DA2. The transmissive area TA includes an area through which light emitted from the component 20 and/or light progressing toward the component 20 may pass. In a display panel, a transmittance of the transmissive area TA may be about 30% or more, about 40% or more, about 50% or more, about 60% or more, about 70% or more, about 75% or more, about 80% or more, about 85% or more, or about 90% or more.

The component 20 may include a sensor such as a proximity sensor, an illumination sensor, an ins sensor, and a face recognition sensor, and a camera (or image sensor). The component 20 may use light. For example, the component 20 may emit and/or receive light in infrared, ultraviolet, and visible bands. The proximity sensor, which uses infrared light, may detect an object arranged close to an upper surface of the electronic apparatus 1, and the illumination sensor may detect a brightness of light incident to the upper surface of the electronic apparatus 1. In addition, the iris sensor may photograph an iris of a person above the upper surface of the electronic apparatus 1, and the camera may receive light for an object arranged on the upper surface of the electronic apparatus 1.

To prevent a function of the thin-film transistor TFT arranged in the second display area DA2 from being deteriorated by light passing through the transmissive area TA, a metal layer (hereinafter, referred to as a bottom metal layer BML) may be arranged below the thin-film transistor TFT in the second display area DA2. For example, the bottom metal layer BML may be between the substrate 100 and the thin-film transistor TFT. The bottom metal layer BML is arranged in the second display area DA2, and may include an opening BML-OP (hereinafter, referred to as a first opening) overlapping the transmissive area TA.

A protective layer 110 may be arranged between the substrate 100 and the thin-film transistor TFT. The protective layer 110 may prevent the substrate 100 from being damaged by a laser used in a formation process of the thin-film transistor TFT. The protective layer 110 may include amorphous silicon (a-Si), Si-rich silicon oxynitride, or an alternate stack structure of silicon oxide and silicon nitride.

The protective layer 110 may cover the entire upper surface of the substrate 100 to protect the substrate 100. The protective layer 110 is integrally provided as a single body in the first display area DA1 and the second display area DA2, but may include an opening 110OP (hereinafter, referred to as a second opening) overlapping the transmissive area TA.

The encapsulation layer 300 may cover each of the light-emitting diodes LED. The encapsulation layer 300 may include at least one inorganic encapsulation layer and at least one organic encapsulation layer. The encapsulation layer 300 may cover entireties of the first display area DA1 and the second display area DA2.

The input detection layer 400 may be provided on the encapsulation layer 300. The input detection layer 400 may obtain coordinate information according to an external input, for example, a touch event of an object such as a finger or a stylus pen. The input detection layer 400 may include a touch electrode and trace lines connected to the touch electrode. The input detection layer 400 may detect an external input by using a mutual capacitance method or a self-capacitance method.

The anti-reflection layer 600 may reduce reflectivity of (external) light incident toward the display panel from the outside. The anti-reflection layer 600 may include a polarizer. When the anti-reflection layer 600 includes a polarizer, the polarizer may include an opening corresponding to the transmissive area TA.

In another embodiment, the anti-reflection layer 600 may include a light-shielding layer, color filters, and an overcoat layer. The color filters are arranged to overlap the light-emitting diodes LED, respectively, and may transmit light emitted by the light-emitting diode LED, and the light-shielding layer may have a mesh shape surrounding each of the color filters. The color filters and the light-shielding layer are not arranged in the transmissive area TA, but the overcoat layer may be arranged in the transmissive area TA.

The window 700 is arranged on the anti-reflection layer 600. The window 700 may be coupled to the anti-reflection layer 600 through an adhesive layer AL such as an optically clear adhesive. The window 700 may include a glass material or a plastic material. The glass material may include ultra-thin glass. The plastic material may include polyethersulfone, polyacrylate, polyetherimide, polyethylene naphthalate, PET, polyphenylene sulfide, polyarylate, PI, polycarbonate, or cellulose acetate propionate.

Figure 5:
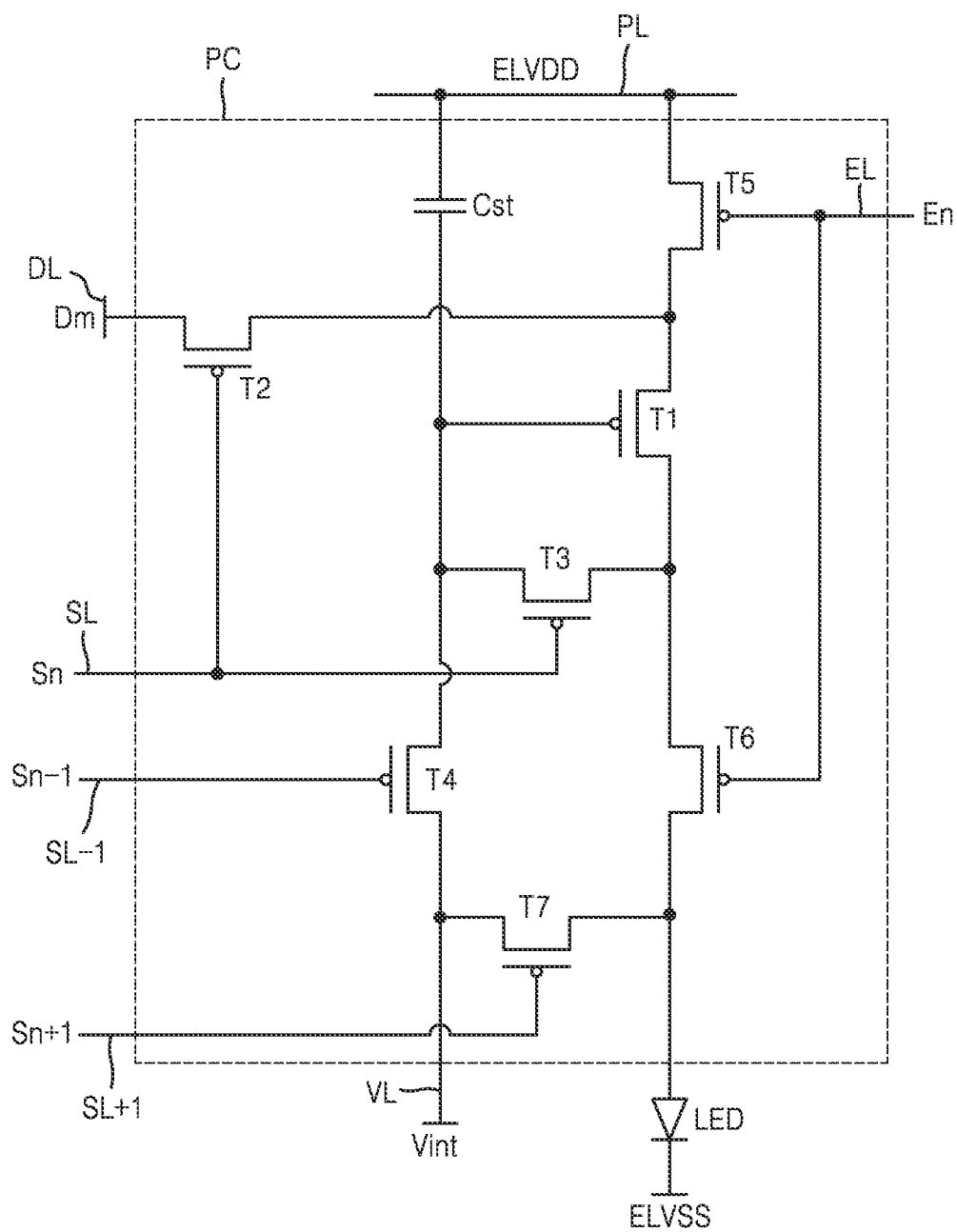
FIG. 5 is an equivalent circuit diagram schematically illustrating a pixel circuit electrically connected to a light-emitting diode of a display panel, according to an embodiment.

FIG. 5 is an equivalent circuit diagram schematically illustrating a pixel circuit PC electrically connected to a light-emitting diode LED of a display panel according to an embodiment.

Referring to FIG. 5, the pixel circuit PC may include a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a storage capacitor Cst.

The first thin-film transistor T1 may receive a data signal Dm according to a switching operation of the second thin-film transistor T2 and supply a driving current to the light-emitting diode LED, and the second thin-film transistor T2 is turned on according to a scan signal Sn received via a scan line SL and performs a switching operation of transmitting the data signal Dm received via a data line DL to the first thin-film transistor T1.

The third thin-film transistor T3 is a compensation thin-film transistor, and a gate electrode of the third thin-film transistor T3 may be connected to the scan line SL. A source electrode (or drain electrode) of the third thin-film transistor T3 may be connected to a first electrode (e.g., an anode) of the light-emitting diode LED through the sixth thin-film transistor T6, and a drain electrode (or source electrode) of the first thin-film transistor T1. A drain electrode (or source electrode) of the third thin-film transistor T3 may be connected to any electrode of the storage capacitor Cst, and may be connected to a source electrode (or drain electrode) of the fourth thin-film transistor T4 and a gate electrode of the first thin-film transistor T1. The third thin-film transistor T3 is turned on according to the scan signal Sn received via the scan line SL, and connects the gate electrode of the first thin-film transistor T1 and the drain electrode of the first thin-film transistor T1 to each other, to diode-connect the first thin-film transistor T1.

The fourth thin-film transistor T4 is an initialization thin-film transistor, and a gate electrode of the fourth thin-film transistor T4 may be connected to a previous scan line SL−1. The drain electrode (or source electrode) of the fourth thin-film transistor T4 may be connected to an initialization voltage line VL. The source electrode (or drain electrode) of the fourth thin-film transistor T4 may be connected to any electrode of the storage capacitor Cst, the drain electrode (or source electrode) of the third thin-film transistor T3, and the gate electrode of the first thin-film transistor T1. The fourth thin-film transistor T4 is turned on according to a previous scan signal Sn−1 received via the previous scan line SL−1, and transfers an initialization voltage Vint to the gate electrode of the first thin-film transistor T1, to perform an initialization operation of initializing a voltage of the gate electrode of the first thin-film transistor T1.

The fifth thin-film transistor T5 is an operation control thin-film transistor, and a gate electrode of the fifth thin-film transistor T5 may be connected to an emission control line EL. A source electrode (or drain electrode) of the fifth thin-film transistor T5 may be connected to a driving voltage line PL. The drain electrode (or source electrode) of the fifth thin-film transistor T5 is connected to the source electrode (or drain electrode) of the first thin-film transistor T1 and a drain electrode (or source electrode) of the second thin-film transistor T2.

The sixth thin-film transistor T6 is an emission control thin-film transistor, and a gate electrode of the sixth thin-film transistor T6 may be connected to the emission control line EL. A source electrode (or drain electrode) of the sixth thin-film transistor T6 may be connected to the drain electrode (or source electrode) of the first thin-film transistor T1 and the source electrode (or drain electrode) of the third thin-film transistor T3. The drain electrode (or source electrode) of the sixth thin-film transistor T6 may be electrically connected to the first electrode (e.g., the anode) of the light-emitting diode LED. The fifth thin-film transistor T5 and the sixth thin-film transistor T6 are simultaneously turned on according to an emission control signal En received via the emission control line EL, and thus, a driving voltage ELVDD is applied to the light-emitting diode LED, and a driving current flows in the light-emitting diode LED.

The seventh thin-film transistor T7 may include an initialization thin-film transistor that initializes the first electrode (e.g., the anode) of the light-emitting diode LED. A gate electrode of the seventh thin-film transistor T7 may be connected to a next scan line SL+1. A source electrode (or drain electrode) of the seventh thin-film transistor T7 may be connected to the first electrode (e.g., the anode) of the light-emitting diode LED. The drain electrode (or source electrode) of the seventh thin-film transistor T7 may be connected to the initialization voltage line VL. The seventh thin-film transistor T7 is turned on according to a next scan signal Sn+1 received via the next scan line SL+1, and may initialize the first electrode (e.g., the anode) of the light-emitting diode LED.

Although FIG. 5 shows a case where the fourth thin-film transistor T4 and the seventh thin-film transistor T7 are connected to the previous scan line SL−1 and the next scan line SL+1, respectively, the fourth thin-film transistor T4 and the seventh thin-film transistor T7 may both be connected to the previous scan line SL−1 and driven according to the previous scan signal Sn−1.

The other electrode of the storage capacitor Cst may be connected to the driving voltage line PL. One electrode of the storage capacitor Cst may be connected to the gate electrode of the first thin-film transistor T1, the drain electrode (or source electrode) of the third thin-film transistor T3, and the source electrode (or drain electrode) of the fourth thin-film transistor T4 together.

An opposite electrode (for example, a cathode) of the light-emitting diode LED receives a common voltage ELVSS. The light-emitting diode LED receives a driving current from the first thin-film transistor T1 to emit light.

In FIG. 5, the pixel circuit PC includes seven thin-film transistors and one storage capacitor, but the present disclosure is not limited thereto. The number of thin-film transistors and the number of storage capacitors may be variously changed according to a design of the pixel circuit PC. For example, the pixel circuit PC may include three or more thin-film transistors.

Figure 6:
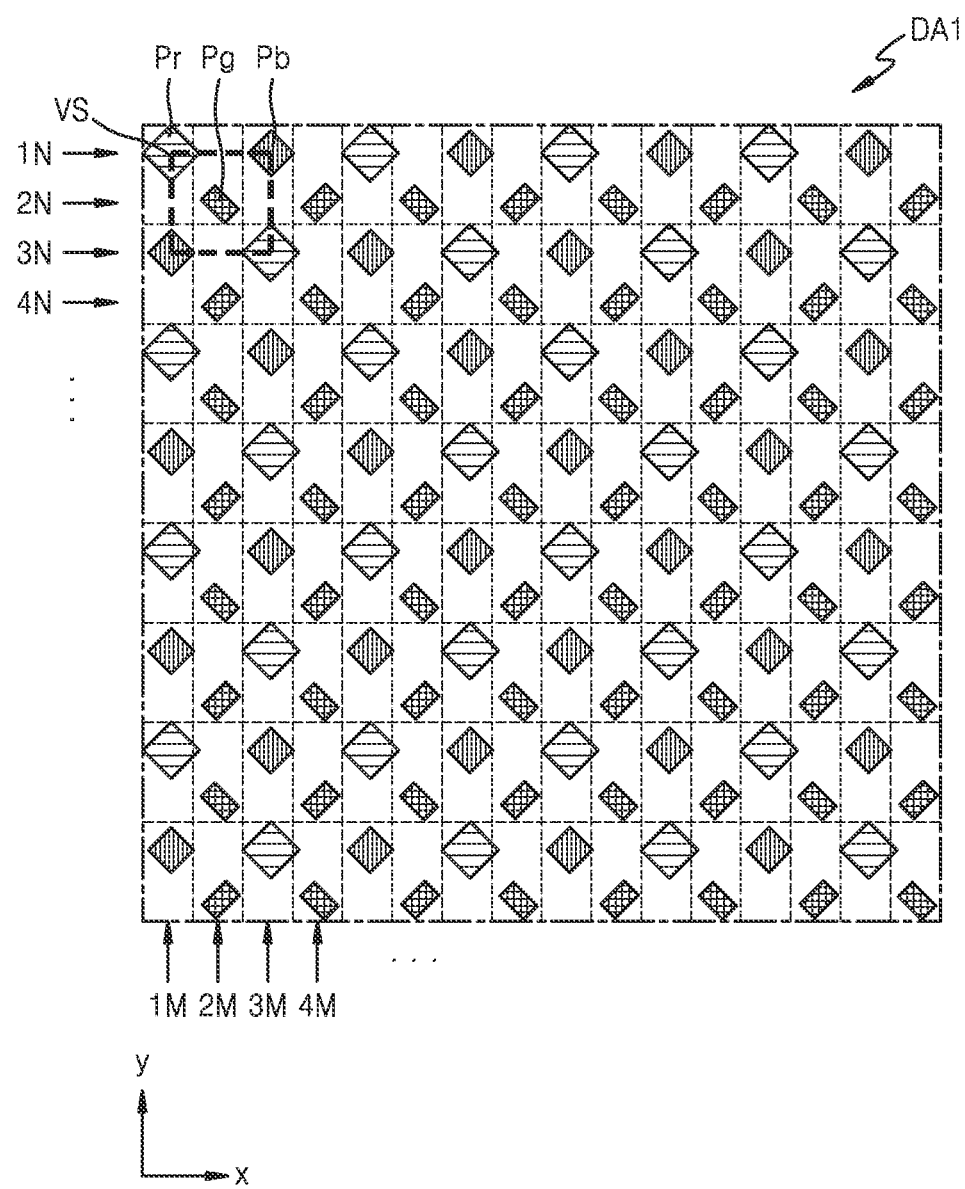
FIG. 6 is a plan view illustrating a portion of a first display area of a display panel according to an embodiment.

FIG. 6 is a plan view illustrating a portion of a first display area DA1 of a display panel according to an embodiment.

Referring to FIG. 6, a plurality of pixels are arranged in a first display area DA1, and the pixels may include first to third pixels emitting light of different colors from each other.

Hereinafter, for convenience of description, it is described that the first pixel is a red pixel Pr, a second pixel is a green pixel Pg, and a third pixel is a blue pixel Pb.

The red pixel Pr, the green pixel Pg, and the blue pixel Pb may be arranged with a certain rule in the first display area DA1. In some embodiments, the red pixel Pr, the green pixel Pg, and the blue pixel Pb may be arranged in a diamond PenTile™ type as shown in FIG. 1.

For example, a plurality of red pixels Pr and a plurality of blue pixels Pb are alternately arranged in a first row 1N, a plurality of green pixels Pg are arranged apart from each other by a distance in a second row 2N adjacent to the first row 1N, a plurality of blue pixels Pb and a plurality of red pixels Pr are alternately arranged in a third row 3N adjacent to the second row 2N, a plurality of green pixels Pg may be arranged apart from each other by a distance in a fourth row 4N adjacent to the third row 3N, and the same pixel arrangement is repeated up to an $N^{th}$ row. In this case, sizes (or areas, widths) of the blue pixel Pb and the red pixel Pr may be greater than a size (or width) of the green pixel Pg. A size (or area, width) of the blue pixel Pb and a size (or area, width) of the red pixel Pr may be a same as or different from each other. In an embodiment, the size (or area, width) of the blue pixel Pb may be less than or greater than the size (or area, width) of the red pixel Pr. The width may is defined as a length along a direction (for example, x direction, or y direction, etc.).

The red pixels Pr and the blue pixels Pb arranged in the first row 1N and the green pixels Pg arranged in the second row 2N are arranged in a staggered manner. Thus, a plurality of red pixels Pr and a plurality of blue pixels Pb are alternately arranged in a first column 1M, a plurality of green pixels Pg are arranged apart from each other by a distance in a second column 2M adjacent to the first column 1M, a plurality of blue pixels Pb and a plurality of red pixels Pr are alternately arranged in a third column 3M adjacent to the second column 2M, a plurality of green pixels Pg are arranged apart from each other by a distance in a fourth column 4M adjacent to the third column 3M, and this pixels arrangement is repeated up to an $M^{th}$ column.

To put this pixel arrangement structure differently, it may be expressed that red pixels Pr are arranged at a first vertex and a third vertex facing each other among vertices of a virtual quadrilateral VS having a center point of a green pixel Pg as a center point of the virtual quadrilateral VS, and blue pixels Pb are arranged at the remaining vertices, that is, a second vertex and a fourth vertex. In this case, the virtual quadrilateral VS may be formed in various shapes, such as a rectangular shape, a rhombus shape, and a square shape.

This pixel arrangement structure is referred to as a diamond-type PenTile™, and may implement high resolution by using a small number of pixels by applying a rendering driving that shares adjacent pixels to express colors.

The red pixels Pr, the green pixels Pg, and the blue pixels Pb shown in FIG. 6 may emit red, green, and blue light, respectively, by using a light-emitting diode arranged in a corresponding pixel. Thus, an arrangement of pixels may correspond to an arrangement of light-emitting diodes that are display elements. For example, a position of a red pixel Pr may indicate a position of a light-emitting diode emitting red light. Likewise, a position of a green pixel Pg may indicate a position of a light-emitting diode emitting green light, and a position of a blue pixel Pb may indicate a position of a light-emitting diode emitting blue light.

Figure 7A:
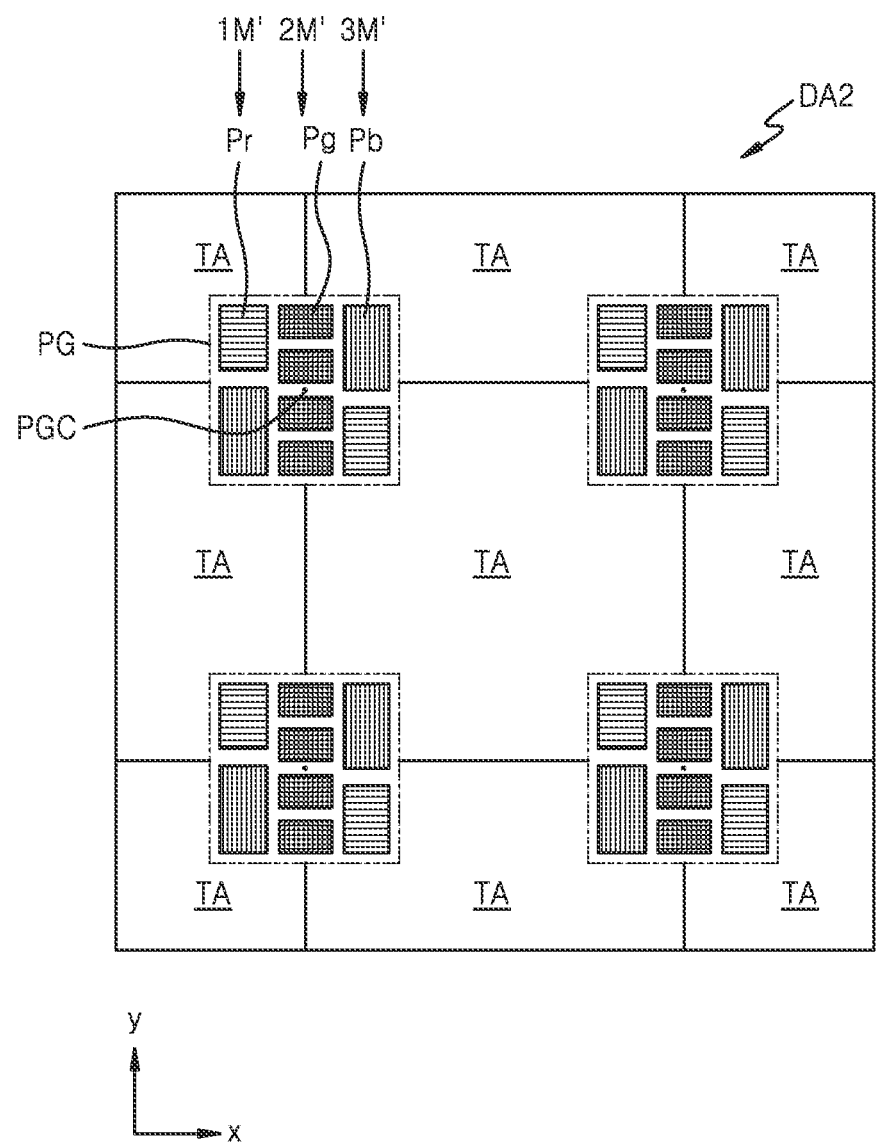
FIGS. 7A and 7B are plan views illustrating a portion of a second display area of a display panel according to an embodiment.
Figure 7B:
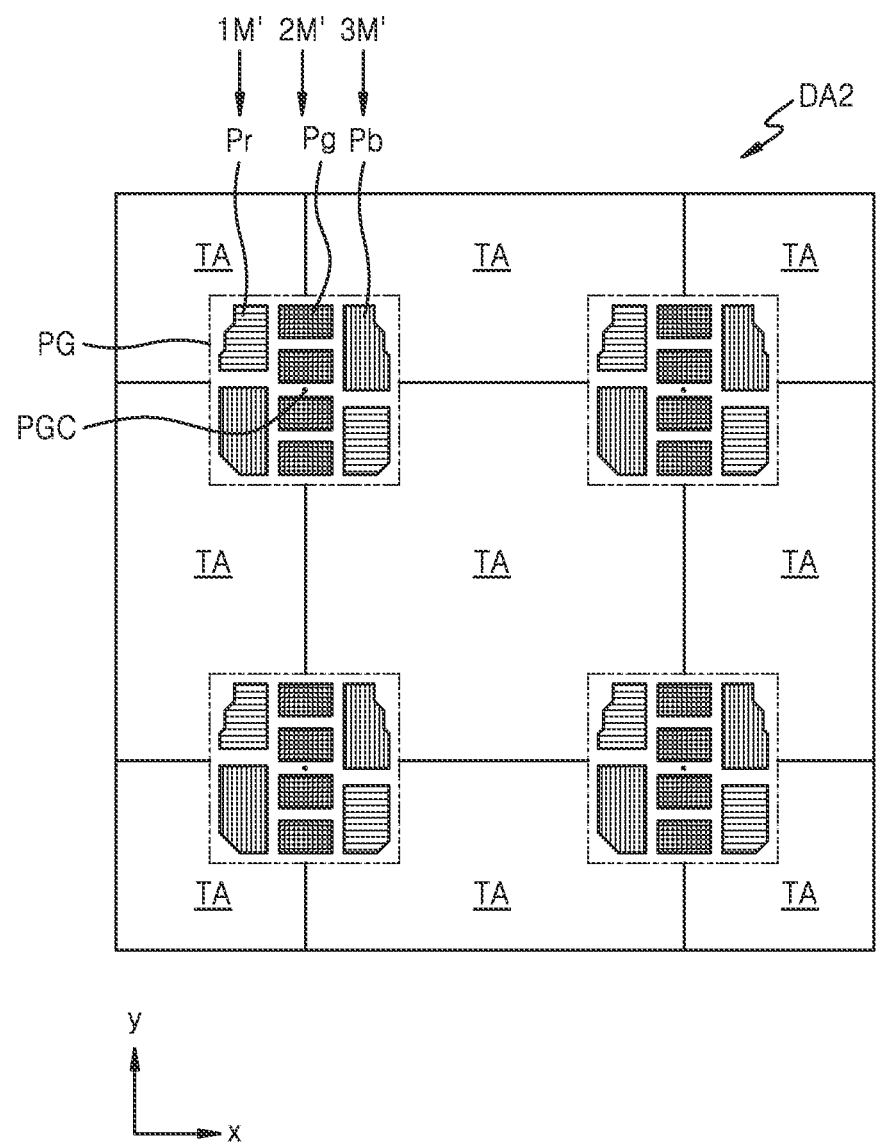

FIGS. 7A and 7B are plan views illustrating a second display area DA2 of a display panel according to an embodiment.

Referring to FIGS. 7A and 7B, pixel groups PG may be apart from one another in the second display area DA2. Each of the pixel groups PG may be surrounded by the transmissive areas TA, and may include pixels emitting light of different colors, for example, a red pixel Pr, a green pixel Pg, and a blue pixel Pb. In an embodiment, each of the pixel groups PG may include two red pixels Pr, four green pixels Pg, and two blue pixels Pb.

A portion of the second display area DA2 in which the pixel groups PG are located may be referred to as a sub-display area. In other words, the second display area DA2 may have the sub-display area and the transmissive area TA adjacent to the sub-display area, and the pixel groups PG may be located in the sub-display area.

The red pixel Pr, the green pixel Pg, and the blue pixel Pb may emit red, green, and blue light, respectively, by using a light-emitting diode arranged in a corresponding pixel, and thus, an arrangement of pixels may correspond to an arrangement of light-emitting diodes that are display elements. Thus, the pixel group PG described with reference to FIGS. 7A and 7B may correspond to a display element group that includes a light-emitting diode emitting red light, a light-emitting diode emitting green light, and a light-emitting diode emitting blue light. For example, each of the pixel groups PG includes a red pixel Pr, a green pixel Pg, and a blue pixel Pb, which are spaced apart from each other. That is, these pixel groups PG may indicate that display element groups including light-emitting diodes which emit red, green, or blue light are arranged apart from each other.

The pixel group PG may be symmetrically arranged with respect to a center PGC of the pixel group PG. For example, red pixels Pr and blue pixels Pb may be arranged in a first column 1M', and four green pixels Pg may be arranged apart from each other by a distance in a second column 2M'. In addition, blue pixels Pb and red pixels Pr may be arranged in a third column 3M'. In this case, the red pixels Pr arranged in the first column 1M' and the red pixels Pr arranged in the third column 3M' may be arranged symmetrical to each other with respect to the center PGC of the pixel group PG. Similarly, the blue pixels Pb arranged in the first column 1M' and the blue pixels Pb arranged in the third column 3M' may be arranged symmetrical to each other with respect to the center PGC of the pixel group PG. The green pixels Pg arranged in the second column 2M' along the y direction may be arranged symmetrical to each other with respect to the center PGC of the pixel group PG.

In an embodiment, a length of the blue pixel Pb in a y direction may be greater than a length of the red pixel Pr in the y direction. The length of the blue pixel Pb in the y direction may be greater than or equal to a sum of lengths of two green pixels Pg in the y direction.

Referring to FIG. 7A, each of the red pixel Pr, the green pixel Pg, and the blue pixel Pb may be approximately quadrilateral in a plan view. For example, each of the red pixel Pr and the blue pixel Pb may have a quadrilateral shape having a short side in an x direction and a long side in the y direction. The green pixel Pg may have a quadrilateral shape having a long side in the x direction and a short side in the y direction.

In another embodiment, at least one of the red pixel Pr, the green pixel Pg, or the blue pixel Pb may have an n-sided polygon shape (n is a natural number greater than or equal to 5). For example, as shown in FIG. 7B, a green pixel Pg may have a quadrilateral shape, but each of the red pixel Pr and the blue pixel Pb may have an edge adjacent to a transmissive area TA that is bent at least once, and thus, may have a shape of an n-sided polygon (n is a natural number greater than or equal to 5) in a plan view.

Figure 8:
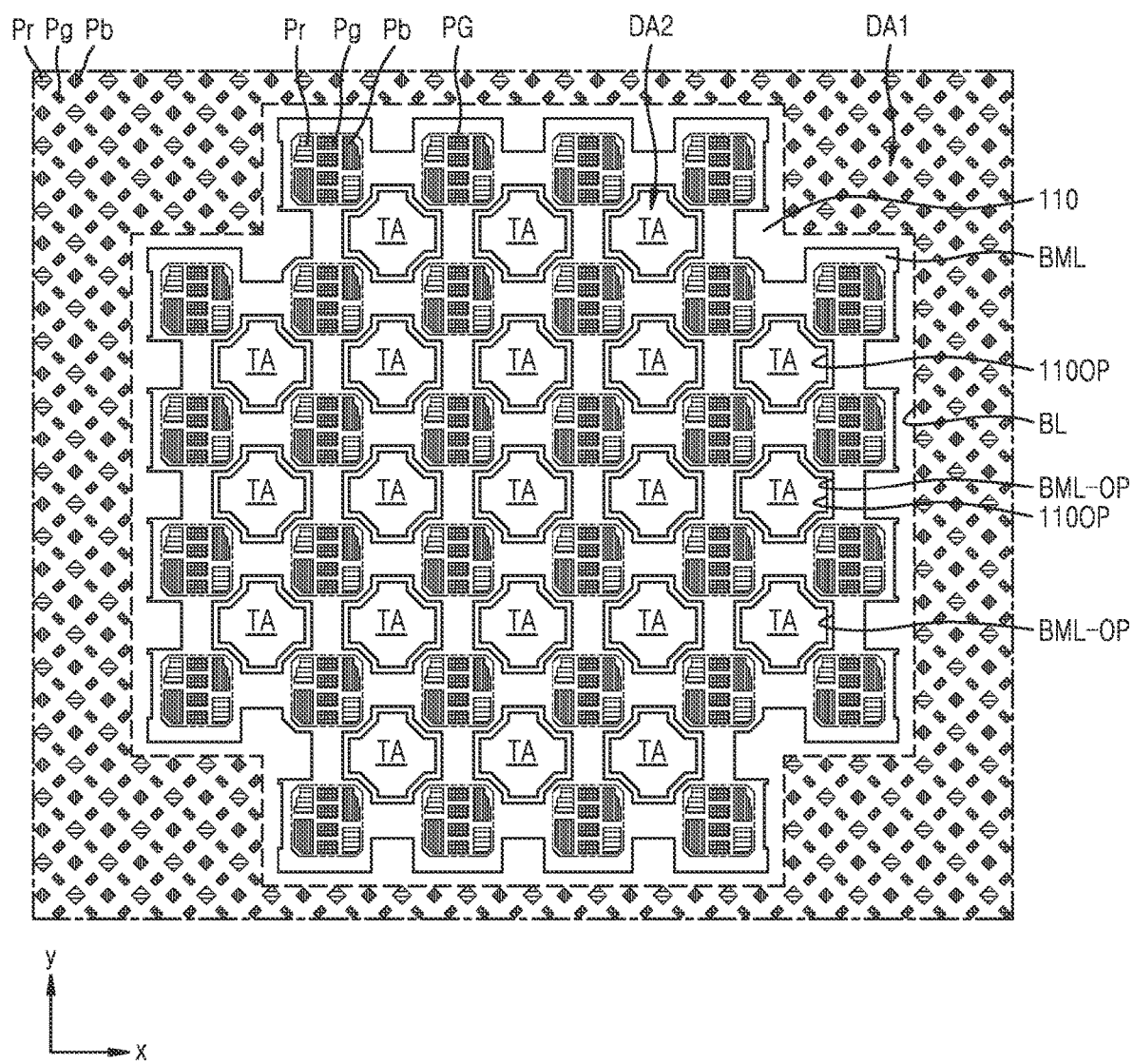
FIG. 8 is a plan view illustrating a second display area of a display panel and a first display area therearound, according to an embodiment.
Figure 9:
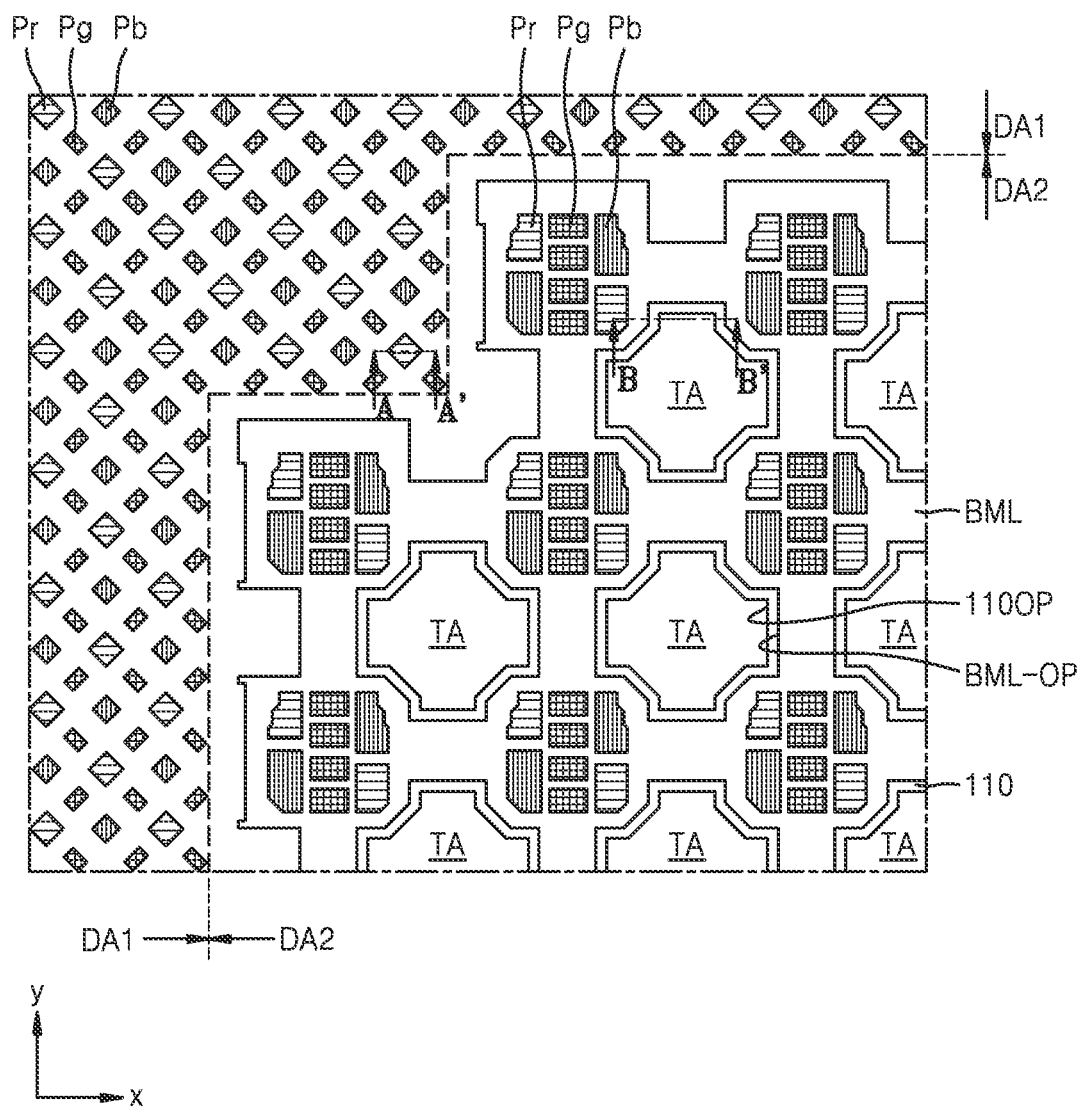
FIG. 9 is a plan view illustrating a portion of FIG. 8.

FIG. 8 is a plan view illustrating a second display area DA2 of a display area and a first display area DA1 therearound, according to an embodiment, and FIG. 9 is a plan view illustrating a portion of FIG. 8.

Referring to FIGS. 8 and 9, red, green, and blue pixels Pr, Pg, and Pb are arranged in the first display area DA1 and the second display area DA2. An arrangement of red, green, and blue pixels Pr, Pg, and Pb in the first display area DA1 may be a same as or different from an arrangement of red, green, and blue pixels Pr, Pg, and Pb in the second display area DA2. In an embodiment, in FIGS. 8 and 9, an arrangement of pixels in the first display area DA2 and an arrangement of pixels in the second display area DA2 are different from each other, and a detailed structure thereof is as described above with reference to FIGS. 6, 7A, and 7B. In another embodiment, red, green, and blue pixels Pr, Pg, and Pb arranged in each of pixel groups PG in the second display area DA2 may have a diamond PenTile™ structure described above with reference to FIG. 6.

A borderline (for example, a virtual borderline) BL arranged between the first display area DA1 and the second display area DA2 may have a polygonal shape in a plan view, as shown in FIG. 8. In an embodiment, in FIG. 8, the borderline BL is a polygon (e.g., an approximately cross-shaped polygon) having 12 sides, and corners of the above-described polygon may have a step configuration. In another embodiment, a number of sides of the borderline BL may less than or greater than 12. The borderline BL arranged between the first display area DA1 and the second display area DA2 may have four sides like a quadrilateral, or may be a polygon having more than 12 sides.

Pixels of the first display area DA1 may be spaced apart from one another, and pixels of the second display area DA2 may also be spaced apart from one another. A distance between a pixel closest to the second display area DA2 among pixels of the first display area DA1 and a pixel closest to the first display area DA1 among pixels of the second display area DA2 may be greater than a distance between pixels adjacent to each other in the first display area DA1, and may be greater than a distance between adjacent pixels arranged in a single pixel group PG in the second display area DA2.

A transmissive area TA may be located in the second display area DA2. The transmissive area TA may be arranged between two pixel groups PG adjacent to each other. Four pixel groups PG may be adjacent to each other with respect to the transmissive area TA. Because a light-emitting diode is located in a pixel, it may be understood that the transmissive area TA is between a light-emitting diode of one pixel group PG and a light-emitting diode of another pixel group PG.

A bottom metal layer BML may not be located in the first display area DA1, but may be located in the second display area DA2. The bottom metal layer BML may include a plurality of first openings BML-OP in the transmissive area TA. Edges of the bottom metal layer BML that define each of the first openings BML-OP may correspond to an outer contour of the first opening BML-OP. When viewed from a direction perpendicular to the substrate 100, the first openings BML-OP of the bottom metal layer BML may overlap the transmissive areas TA.

As shown in FIGS. 8 and 9, in a plan view, the bottom metal layer BML may have a mesh structure in which first portions overlapping the pixel groups PG and second portions connecting the first portions to each other are integrally provided as a single body. The first openings BML-OP of the bottom metal layer BML are spaced apart from each other, but may be arranged to form rows and columns. An outer edge of the bottom metal layer BML may be arranged between the first display area DA1 and the second display area DA2, for example, may be arranged adjacent to the borderline BL.

A protective layer 110 may be arranged between the substrate 100 and the bottom metal layer BML as described above with reference to FIG. 4. The protective layer 110 may be integrally provided as a single body in the first display area DA1 and the second display area DA2, and may include second openings 110OP in the transmissive area TA. When viewed from a direction perpendicular to the substrate 100, the second openings 110OP of the protective layer 110 may overlap the transmissive areas TA, and may be spaced apart from each other and arranged in rows and columns.

The second openings 110OP of the protective layer 110 and the first openings BML-OP of the bottom metal layer BML may overlap each other and define the transmissive area TA. An outer contour of each of the transmissive areas TA may be defined by the second opening 110OP of the protective layer 110 and/or the first opening BML-OP of the bottom metal layer BML. In an embodiment, as shown in FIGS. 8 and 9, the second opening 110OP of the protective layer 110 may have a size (or area, width) less than that of the first opening BML-OP of the bottom metal layer BML, and in this case, a size (or area, width) of the transmissive area TA may be defined by the second opening 110OP of the protective layer 110. That is, an outer line of the first opening BML-OP of the bottom metal layer BML surrounds an outer line of the second opening 110OP of the protective layer 110, in a plan view.

As described above with reference to FIG. 4, the transmissive area TA includes an area through which light and/or sound may pass, and the component 20 (see FIG. 4) may be arranged to overlap the transmissive area TA. Not all portions of the component 20 correspond to the transmissive area TA, and as shown in FIG. 3, a portion of the component 20 may correspond to the transmissive area TA, and the other portion may correspond to pixels in the second display area DA2.

A space arranged between the pixel groups PG located at an outermost portion of the second display area DA2 and the first display area DA1 may not be a transmissive area. For example, a space arranged between the pixel groups PG located at the outermost portion of the second display area DA2 and the first display area DA1 may include a portion in which the bottom metal layer BML is not present, but the corresponding portion may not be a transmissive area.

Figure 10:
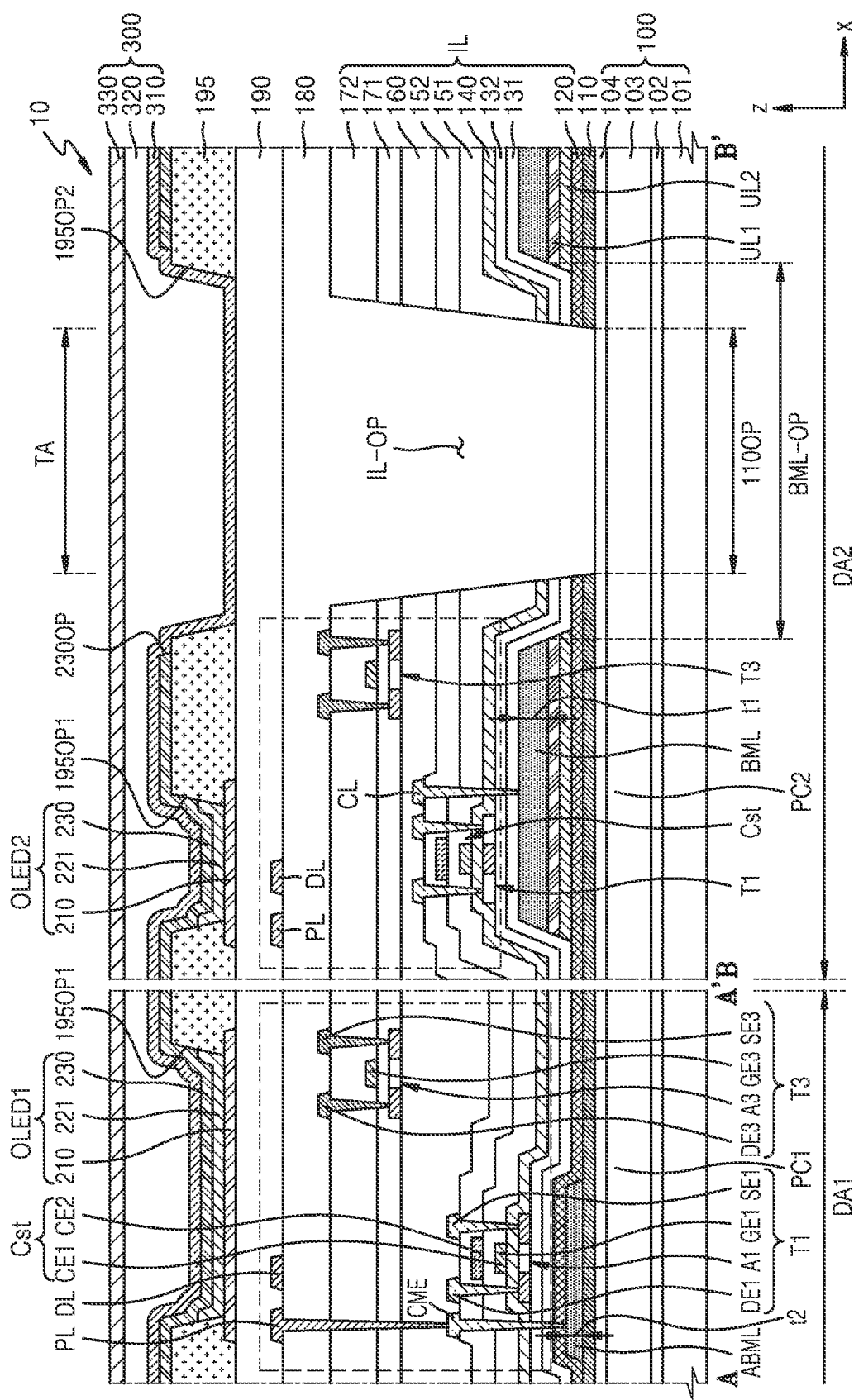
FIG. 10 is a cross-sectional view of a display panel in FIG. 9 taken along lines A-A' and B-B' in FIG. 9, according to an embodiment.

FIG. 10 is a cross-sectional view of a display panel 10 in FIG. 9 taken along lines A-A' and B-B' in FIG. 9, according to an embodiment. As described above with reference to FIG. 4, the display panel 10 in FIG. 10 may include an input detection layer 400 (see FIG. 4), an anti-reflection layer 600 (see FIG. 4), and a window 700 (see FIG. 4), above an encapsulation layer 300. However, in FIG. 10, the input detection layer 400 (see FIG. 4), the anti-reflection layer 600 (see FIG. 4), and the window 700 (see FIG. 4) are omitted, for convenience of description. An organic light-emitting diode may be arranged in the first display area DA1 and the second display area DA2.

In FIG. 10, a light-emitting diode of the display panel 10 includes an organic light-emitting diode. For convenience of description, an organic light-emitting diode arranged in the first display area DA1 will be referred to as a first organic light-emitting diode OLED1, and an organic light-emitting diode arranged in the second display area DA2 will be referred to as a second organic light-emitting diode OLED2.

Referring to FIG. 10, the first organic light-emitting diode OLED1 and the second organic light-emitting diode OLED2 are provided on the substrate 100.

The substrate 100 may include a first base layer 101, a first barrier layer 102, a second base layer 103, and a second barrier layer 104. The first base layer 101 and the second base layer 103 may each include a polymer resin, and the first barrier layer 102 and the second barrier layer 104 may each include an inorganic insulating material. The polymer resin may include polyethersulfone, polyacrylate, polyetherimide, polyethylene naphthalate, PET, polyphenylene sulfide, polyarylate, PI, polycarbonate, and/or cellulose acetate propionate. The polymer resin may include a transparent material. In an embodiment, the polymer resin may have a transmittance of light having a relatively short wavelength band such as 400 nm to about 500 nm, of greater than about 70%. For example, the polymer resin may have a transmittance of about 75% or greater in a wavelength band of about 400 nm to about 550 nm.

Each of the first barrier layer 102 and the second barrier layer 104 may include silicon nitride, silicon oxynitride, and/or silicon oxide. At least one of the first barrier layer 102 or the second barrier layer 104 may have a multi-layer structure. For example, the second barrier layer 104 may have a double-layer structure of silicon oxynitride and silicon oxide.

The protective layer 110 may be arranged on the substrate 100. The protective layer 110 may protect the substrate 100 from a formation process of the display panel 10. In an embodiment, first and second pixel circuits PC1 and PC2 electrically connected to the first and second organic light-emitting diodes OLED1 and OLED2, respectively, may each include a semiconductor layer including polysilicon. The semiconductor layer including polysilicon may be provided by forming amorphous silicon and then, crystallizing the amorphous silicon by irradiating a laser beam (e.g., a laser beam of about 308 nm) to the amorphous silicon. In this case, when the laser beam reaches the substrate 100, a defect may be caused in the substrate 100 such that the first barrier layer 102 and/or the substrate 100 are locally swollen by the laser beam. However, according to an embodiment, the protective layer 110 is between the substrate 100 and the semiconductor layer described above, and thus, the above-described laser beam may be prevented from progressing toward the substrate 100.

The protective layer 110 may include a material capable of absorbing a laser beam. For example, the protective layer 110 may include a material having a transmittance of about 10% or less in a wavelength band of about 250 nm to about 350 nm. In some embodiments, a transmittance of about 10% or less in a wavelength band of about 280 nm to about 310 nm. The protective layer 110 may include an a-Si layer, a Si-rich silicon oxynitride (SiON) layer, or an alternate stack structure of a SiON layer and a silicon nitride layer (for example, a structure in which the SiON layer and the silicon nitride layer are alternately stacked about 10 times or more).

The protective layer 110 may be provided as a single body in the first display area DA1 and the second display area DA2, and may include the second opening 110OP in the transmissive area TA located in the second display area DA2.

Semiconductor layers of the first pixel circuit PC1 and the second pixel circuit PC2, for example, silicon-based semiconductor layers, may be provided on the protective layer 110. Regarding the above, FIG. 10 shows that a first semiconductor layer A1 of the first thin-film transistor T1 of each of the first and second pixel circuits PC1 and PC2 is arranged on the protective layer 110.

The first semiconductor layer A1 of the first thin-film transistor T1 may be provided by forming a polysilicon layer entirely covering the upper surface of the substrate 100, and then patterning the polysilicon layer. In this case, as described above, the polysilicon layer entirely covering the upper surface of the substrate 100 may be provided by forming an a-Si layer entirely covering the upper surface of the substrate 100, and then irradiating a laser beam to the a-Si layer.

Before the semiconductor layer including polysilicon (for example, the first semiconductor layer A1 of the first thin-film transistor T1) is provided, the bottom metal layer BML may be provided in the second display area DA2. In an embodiment, before the semiconductor layer including polysilicon is provided, an additional metal layer ABML may be provided in the first display area DA1, and FIG. 10 shows a case where the bottom metal layer BML is provided in the second display area DA2 and the additional metal layer ABML is provided in the first display area DA1.

The additional metal layer ABML is located in the first display area DA1, and may overlap a portion of the first pixel circuit PC1. For example, the additional metal layer ABML may overlap some of a plurality of thin-film transistors included in the first pixel circuit PC1. Regarding the above, FIG. 10 shows that the additional metal layer ABML overlaps the first thin-film transistor T1, which is a driving thin-film transistor of the first pixel circuit PC1.

The additional metal layer ABML may be electrically connected to the driving voltage line PL of the first pixel circuit PC1 through a connection electrode CME, and may have the same voltage level (for example, a constant voltage level) as the driving voltage line PL of the first pixel circuit PC1. The additional metal layer ABML may prevent unnecessary charges from being accumulated on the first semiconductor layer A1 of the first thin-film transistor T1 during an operation of the first pixel circuit PC1. As a result, characteristics of the first thin-film transistor T1 may be stably maintained.

The bottom metal layer BML may be located in the second display area DA2 and may overlap the second pixel circuit PC2. The bottom metal layer BML may overlap all transistors included in the second pixel circuit PC2. For example, the second pixel circuit PC2 may include seven thin-film transistors and one storage capacitor, and the bottom metal layer BML may overlap the seven thin-film transistors and the storage capacitor of the second pixel circuit PC2.

The bottom metal layer BML may have a voltage through a connection line CL. In an embodiment, the bottom metal layer BML may have a constant voltage level as if the bottom metal layer BML were electrically connected to an upper electrode of the storage capacitor Cst and/or a driving voltage line of the second pixel circuit PC2. In some embodiments, the bottom metal layer BML may have a constant voltage level as if the bottom metal layer BML were electrically connected to an initialization voltage line.

The second pixel circuits PC2 by as many as the second organic light-emitting diodes OLED2 may be arranged in the second display area DA2, and the bottom metal layer BML may overlap all transistors of the second pixel circuit PC2.

The first pixel circuits PC1 by as many as the first organic light-emitting diodes OLED1 may be arranged in the first display area DA1. As a thickness t2 of the additional metal layer ABML increases, a step around an edge of the additional metal layer ABML increases. Unlike the bottom metal layer BML, the additional metal layer ABML overlaps some thin-film transistors of the first pixel circuit PC1, and thus, when a step increases around an edge of the additional metal layer ABML, a thin-film transistor directly above the additional metal layer ABML and another thin-film transistor not directly above the additional metal layer ABML may be disconnected from each other.

For example, the first semiconductor layer A1 of the first thin-film transistor T1 arranged above the additional metal layer ABML may be integrally provided as a single body with a semiconductor layer of the second thin-film transistor of the first pixel circuit PC1. In this case, when the thickness t2 of the additional metal layer ABML is sufficiently large, the first semiconductor layer A1 of the first thin-film transistor T1 and the semiconductor layer of the second thin-film transistor may be physically and electrically disconnected from each other by a step around the edge of the additional metal layer ABML.

On the other hand, the bottom metal layer BML may have a thickness t1 enough to prevent a function of the thin-film transistor TFT arranged in the second display area DA2 from being deteriorated by light passing through the transmissive area TA. Thus, the thickness t1 of the bottom metal layer BML may be greater than the thickness t2 of the additional metal layer ABML. Unlike the additional metal layer ABML, the bottom metal layer BML overlaps all thin-film transistors in the second display area DA2, and thus, an electrical disconnection problem of thin-film transistors due to the step around the edge of the additional metal layer ABML does not occur.

Each of the bottom metal layer BML and the additional metal layer ABML may include a metal having conductivity, such as aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The bottom metal layer BML and the additional metal layer ABML may include a same material as each other. In some embodiments, the bottom metal layer BML and the additional metal layer ABML may include different materials from each other.

A first interlayer insulating layer 120 may be arranged above the additional metal layer ABML in the first display area DA1 and arranged below the bottom metal layer BML in the second display area DA2. That is, the first interlayer insulting layer 120 may be arranged between the bottom metal layer BML and the additional metal layer ABML. The first interlayer insulating layer 120 may be located in the first and second display areas DA1 and DA2 so as to entirely cover the upper surface of the substrate 100. The first interlayer insulating layer 120 may include an inorganic insulating material such as silicon oxide, SiON, and silicon nitride, and may have a single-layer or a multi-layer structure including the materials described above.

A second lower layer UL2 may be arranged below the bottom metal layer BML to prevent reflection by the bottom metal layer BML. The second lower layer UL2 may include the same material as the protective layer 110. The second lower layer UL2 may include an a-Si layer, a Si-rich SiON layer, or an alternate stack structure of a SiON layer and a silicon nitride layer (for example, a structure in which the SiON layer and the silicon nitride layer are alternately stacked about 10 times or more). In another embodiment, the second lower layer UL2 includes the materials described above, and may include a material different from a material of the protective layer 110.

To improve an adhesive force between the second lower layer UL2 and the bottom metal layer BML, a first lower layer UL1 may be arranged between the second lower layer UL2 and the bottom metal layer BML. The first lower layer UL1 may include, for example, an inorganic insulating material such as silicon oxide. Each of the first lower layer UL1 and the second lower layer UL2 may have a same planar shape as the bottom metal layer BML. In other words, the first lower layer UL1 and the second lower layer UL2 are located only below the bottom metal layer BML, and may not be present in an area in which the bottom metal layer BML is not located.

A third barrier layer 131 and a buffer layer 132 may be provided on the bottom metal layer BML and the additional metal layer ABML. Each of the third barrier layer 131 and the buffer layer 132 may include an inorganic insulating material such as SiON and silicon nitride, and may have a single-layer or a multi-layer structure including the materials described above.

The first and second pixel circuits PC1 and PC2 are provided on the buffer layer 132. Regarding the above, FIG. 10 shows the first thin-film transistor T1, the storage capacitor Cst, and the third thin-film transistor T3 provided in each of the first display area DA1 and the second display area DA2.

The first thin-film transistor T1 may include the first semiconductor layer A1, a first gate electrode GE1, a first source electrode SE1, and a first drain electrode DE1. The first semiconductor layer A1 may include polysilicon, and includes a first channel area overlapping the first gate electrode GE1, and a first source area and a first drain area respectively arranged at opposite sides of the first channel area.

The first gate electrode GE1 may be located on the first semiconductor layer A1 with respect to a first gate insulating layer 140 therebetween. The first gate electrode GE1 may include a low-resistance conductive material such as Mo, Al, Cu, and/or Ti, and may have a single-layer or a multi-layer structure of the above-described materials.

The first source electrode SE1 and the first drain electrode DE1 may be arranged on a second interlayer insulating layer 151 and a third interlayer insulating layer 152. Each of the second interlayer insulating layer 151 and the third interlayer insulating layer 152 may include an inorganic insulating material such as SiON and silicon nitride, and may have a single-layer or a multi-layer structure including the materials described above.

The first source electrode SE1 and the first drain electrode DE1 may be connected to a first source area and a first drain area of the first semiconductor layer A1 through contact holes penetrating the second interlayer insulating layer 151 and the third interlayer insulating layer 152, respectively. Each of the first source electrode SE1 and the first drain electrode DE1 may include Al, Pt, Pd, Ag, Mg, Au, Ni, Nd, Ir, Cr, Ca, Mo, Ti, W, and/or Cu, and may have a single-layer or multi-layer structure including the materials described above. For example, the first source electrode SE1 and the first drain electrode DE1 may have a three-layer structure of a Ti layer, an Al layer, and another Ti layer.

The storage capacitor Cst may include a first electrode CE1 and a second electrode CE2. The storage capacitor Cst may overlap the first thin-film transistor T1, which is a driving thin-film transistor.

In an embodiment, the first electrode CE1 may be integrally provided as a single body with the first gate electrode GE1 of the first thin-film transistor T1 that is a driving thin-film transistor. In other words, the first gate electrode GE1 of the first thin-film transistor T1 may include the first electrode CE1. The second electrode CE2 may overlap the first electrode CE1 with respect to the second interlayer insulating layer 151 therebetween. The second electrode CE2 may include a low-resistance conductive material such as Mo, Al, Cu, and/or Ti, and may have a single-layer or a multi-layer structure of the above-described materials.

A fourth interlayer insulating layer 160 may be arranged on a thin-film transistor including a silicon-based semiconductor layer, for example, the first thin-film transistor T1. The fourth interlayer insulating layer 160 may include an inorganic insulating material such as SiON and silicon nitride, and may have a single-layer or a multi-layer structure including the materials described above.

A thin-film transistor including an oxide-based semiconductor layer, for example, the third thin-film transistor T3, may be arranged on the fourth interlayer insulating layer 160. The third thin-film transistor T3 may include a third semiconductor layer A3, a third gate electrode GE3, a third source electrode SE3, and a third drain electrode DE3. The third semiconductor layer A3 may include an oxide-based semiconductor. For example, the third semiconductor layer A3 may include an oxide semiconductor of at least one material selected from the group consisting of indium (In), gallium (Ga), stannum (Sn), zirconium (Zr), vanadium (V), hafnium (Hf), cadmium (Cd), germanium (Ge), Cr, Ti, and zinc (Zn). The third semiconductor layer A3 may include a third channel area overlapping the third gate electrode GE3, and a third source area and a third drain area respectively arranged at opposite sides of the third channel area.

The third gate electrode GE3 may be located on the third semiconductor layer A3 with respect to a second gate insulating layer 171 therebetween. The third gate electrode GE3 may include a low-resistance conductive material such as Mo, Al, Cu, and/or Ti, and may have a single-layer or a multi-layer structure of the above-described materials. The second gate insulating layer 171 may include an inorganic insulating material such as SiON and silicon nitride, and may have a single-layer or a multi-layer structure including the materials described above.

The third source electrode SE3 and the third drain electrode DE3 may be arranged on a fourth interlayer insulating layer 172. The fourth interlayer insulating layer 172 may include an inorganic insulating material such as SiON and silicon nitride, and may have a single-layer or a multi-layer structure including the materials described above.

The third source electrode SE3 and the third drain electrode DE3 may be connected to a third source area and a third drain area of the third semiconductor layer A3 through contact holes penetrating second gate insulating layer 171 and the fourth interlayer insulating layer 172, respectively. Each of the third source electrode SE3 and the third drain electrode DE3 may include Al, Pt, Pd, Ag, Mg, Au, Ni, Nd, Ir, Cr, Ca, Mo, Ti, W, and/or Cu, and may have a single-layer or multi-layer structure including the materials described above. For example, the third source electrode SE3 and the third drain electrode DE3 may have a three-layer structure of a Ti layer, an Al layer, and another Ti layer.

A first organic insulating layer 180 may be arranged on the thin-film transistors of the first pixel circuit PC1 and the second pixel circuit PC2. The first organic insulating layer 180 may include a siloxane-based organic material or an imide-based organic material. The first organic insulating layer 180 may include an organic insulating material such as hexamethyldisiloxane (HMDSO), acryl, benzocyclobutene (BCB), and PI.

A stacked body IL (hereinafter, referred to as a stacked body) of inorganic insulating layers arranged between the substrate 100 and the first organic insulating layer 180, for example, the first interlayer insulating layer 120, the third barrier layer 131, the buffer layer 132, the first gate insulating layer 140, the second interlayer insulating layer 151, the third interlayer insulating layer 152, the fourth interlayer insulating layer 160, the second gate insulating layer 171, and the fourth interlayer insulating layer 172, may be integrally provided as a single body in the first display area DA1 and the second display area DA2. To improve a transmittance in the transmissive area TA, the stacked body IL may include an opening IL-OP (hereinafter, referred to as a third opening) in the transmissive area TA. A portion of the first organic insulating layer 180 arranged on the stacked body IL may be present (located or exist) in the third opening IL-OP. In other words, the portion of the first organic insulating layer 180 may at least partially fill the third opening IL-OP.

The third opening IL-OP of the stacked body IL may overlap the second opening 110OP of the protective layer 110. The third opening IL-OP of the stacked body IL and the second opening 110OP of the protective layer 110 may be provided together in a same process.

A portion of the first organic insulating layer 180 may be present in the second opening 110OP of the protective layer 110. For example, a portion of the first organic insulating layer 180 may pass through the third opening IL-OP of the stacked body IL and be in the second opening 110OP of the protective layer 110. The portion of the first organic insulating layer 180 may come into contact with the stacked body IL through the third opening IL-OP of the stacked body IL and the second opening 110OP of the protective layer 110. The portion of the first organic insulating layer 180 may come into direct contact with the second barrier layer 104, which is an uppermost layer of the substrate 100. For example, as shown in FIG. 10, the portion of the first organic insulating layer 180 may come into direct contact with an upper surface of the second barrier layer 104.

When viewed from a direction perpendicular to the upper surface of the substrate 100 (i.e., in a plan view), the entirety of the second opening 110OP of the protective layer 110 overlaps the first opening BML-OP of the bottom metal layer BML, and a size (or width, diameter) of the second opening 110OP of the protective layer 110 may be less than a size (or width, diameter) of the first opening BML-OP of the bottom metal layer BML, and the transmissive area TA may be defined by the second opening 110OP of the protective layer 110.

In some embodiments, in a formation process of the third opening IL-OP of the stacked body IL and the second opening 110OP of the protective layer 110, a portion of the second barrier layer 104 of the substrate 100 may be removed together. For example, a thickness of the portion of the second barrier layer 104 (a portion overlapping the third opening IL-OP of the stacked body IL and/or the second opening 110OP of the protective layer 110) may be less than a thickness of other portions. Even in this case, the portion of the first organic insulating layer 180 may come into direct contact with the second barrier layer 104 that is the uppermost layer of the substrate 100.

The data line DL and the driving voltage line PL may be arranged on the first organic insulating layer 180 and covered by a second organic insulating layer 190. The second organic insulating layer 190 may include a siloxane-based organic material. The second organic insulating layer 190 may include an organic insulating material such as HMDSO, acryl, BCB, and PI.

FIG. 10 shows that the second organic insulating layer 190 is arranged on the first organic insulating layer 180, but in another embodiment, the second organic insulating layer 190 may be omitted. In this case, the data line DL and the driving voltage line PL may be arranged below the first organic insulating layer 180.

The first electrodes 210 of the first organic light-emitting diode OLED1 and the second organic light-emitting diode OLED2 may be arranged on an organic insulating layer, for example, the second organic insulating layer 190. The first electrode 210 may include a reflective layer including Ag, Mg, Al, Pt, Pd, Au, Ni, Nd, Ir, Cr, or any compounds thereof. The first electrode 210 may include a reflective layer including the materials described above and a transparent conductive layer above and/or below the reflective film. The transparent conductive layer may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). For example, the first electrode 210 may have a three-layer structure of an ITO layer, an Ag layer, and another ITO layer.

A bank layer 195 covers an edge of the first electrode 210, and includes an opening 195OP1 overlapping the first electrode 210 of the first organic light-emitting diode OLED1 and second organic light-emitting diode OLED2 respectively, and the bank layer 195 may include a transmissive organic insulating layer. For example, the bank layer 195 may include HMDSO, acryl, BCB, PI, and the like.

In another embodiment, the bank layer 195 may include a light-shielding material. The bank layer 195 may include a black dye or pigment. For example, the bank layer 195 may include a cardo-based binder resin and pigment. In this case, a mixture of a lactam black pigment and a blue pigment may be used as a dye. In some embodiments, the bank layer 195 may include carbon black.

To ensure a transmittance of the transmissive area TA, the bank layer 195 may include an opening 195OP2 in the transmissive area TA.

An emission layer 221 may overlap the first electrode 210. The emission layer 221 may be at least partially present in the opening 195OP1 of the bank layer 195 located on the first electrode 210, and may include a polymer organic material or a low-molecular weight organic material that emit light of a color. A functional layer may be arranged below and above the emission layer 221. The functional layer may include at least one selected from among a hole transport layer, a hole injection layer, an electron transport layer, and an electron injection layer.

A second electrode 230 may include a conductive material having a low work function. The second electrode 230 may include a (semi-)transparent layer including Ag, Mg, Al, Pt, Pd, Au, Ni, Nd, Ir, Cr, Li, Ca, or any alloys thereof. In some embodiments, the second electrode 230 may further include a layer including ITO, IZO, ZnO, or $In_2O_3$, above the (semi-)transparent layer including the materials described above. The second electrode 230 may be integrally provided as a single body in the first display area DA1 and the second display area DA2, and an opening 230OP of the second electrode 230 may be defined in the transmissive area TA.

An encapsulation layer 300 may include at least one inorganic encapsulation layer and at least one organic encapsulation layer. In an embodiment, the encapsulation layer 300 may include a first inorganic encapsulation layer 310, a second inorganic encapsulation layer 330, and an organic encapsulation layer 320 therebetween.

Each of the first inorganic encapsulation layer 310 and the second inorganic encapsulation layer 330 may include one or more inorganic insulating materials such as silicon oxide, SiON, and silicon nitride. The organic encapsulation layer 320 may include a polymer-based material. The polymer-based material may include silicon resin, acryl resin, epoxy resin, PI, polyethylene, and the like. The first inorganic encapsulation layer 310, the organic encapsulation layer 320, and the second inorganic encapsulation layer 330 may entirely cover a display area.

FIG. 10 shows the first thin-film transistor T1 as a thin-film transistor including a silicon-based semiconductor layer, and shows the third thin-film transistor T3 as a thin-film transistor including an oxide-based semiconductor layer. However, the present disclosure is not limited thereto. For example, as described above with reference to FIG. 5, when each of the first pixel circuit PC1 and the second pixel circuit PC2 includes seven thin-film transistors, thin-film transistors each including an oxide-based semiconductor layer may include the third thin-film transistor T3 and the fourth thin-film transistor T4, and the remaining thin-film transistors may include a silicon-based semiconductor layer.

FIG. 10 shows that each of the first pixel circuit PC1 and the second pixel circuit PC2 includes a thin-film transistor including a silicon-based semiconductor layer and a thin-film transistor including an oxide-based semiconductor layer, but the present disclosure is not limited thereto. In another embodiment, all thin-film transistors included in each of the first pixel circuit PC1 and the second pixel circuit PC2 may include a silicon-based semiconductor layer.

FIG. 10 shows that the first pixel circuit PC1 and the second pixel circuit PC2 include a same number of thin-film transistors and a same number of storage capacitors, but the present disclosure is not limited thereto. For example, the number of storage capacitors of the second pixel circuit PC2 may be greater than the number of storage capacitors of the first pixel circuit PC1. Thus, an overlapping area between electrodes of the storage capacitor of the second pixel circuit PC2 may be greater than an overlapping area between electrodes of the storage capacitors of the first pixel circuit PC1. A capacitance of the storage capacitor of the second pixel circuit PC2 may be greater than a capacitance of the storage capacitor of the first pixel circuit PC1.

FIG. 10 shows that the bottom metal layer BML and the additional metal layer ABML are arranged on different layers from each other with the first interlayer insulating layer 120 therebetween, with the bottom metal layer BML above the first interlayer insulating layer and the additional metal layer ABML below the first interlayer insulating layer 120. However, the present disclosure is not limited thereto. For example, referring to FIG. 11 corresponding to a cross-section of the display panel in FIG. 9 taken along lines A-A' and B-B' in FIG. 9, according to another embodiment, the bottom metal layer BML may be arranged below the first interlayer insulating layer 120, and the additional metal layer ABML may be arranged on the first interlayer insulating layer 120.

The second lower layer UL2 (see FIG. 10) below the bottom metal layer BML described above with reference to FIG. 10 may include a same material as the protective layer 110 (see FIG. 10), and thus, to reduce a number of processes for simplification of process, the protective layer 110 may have a function of the second lower layer UL2 of FIG. 10.

Figure 11:
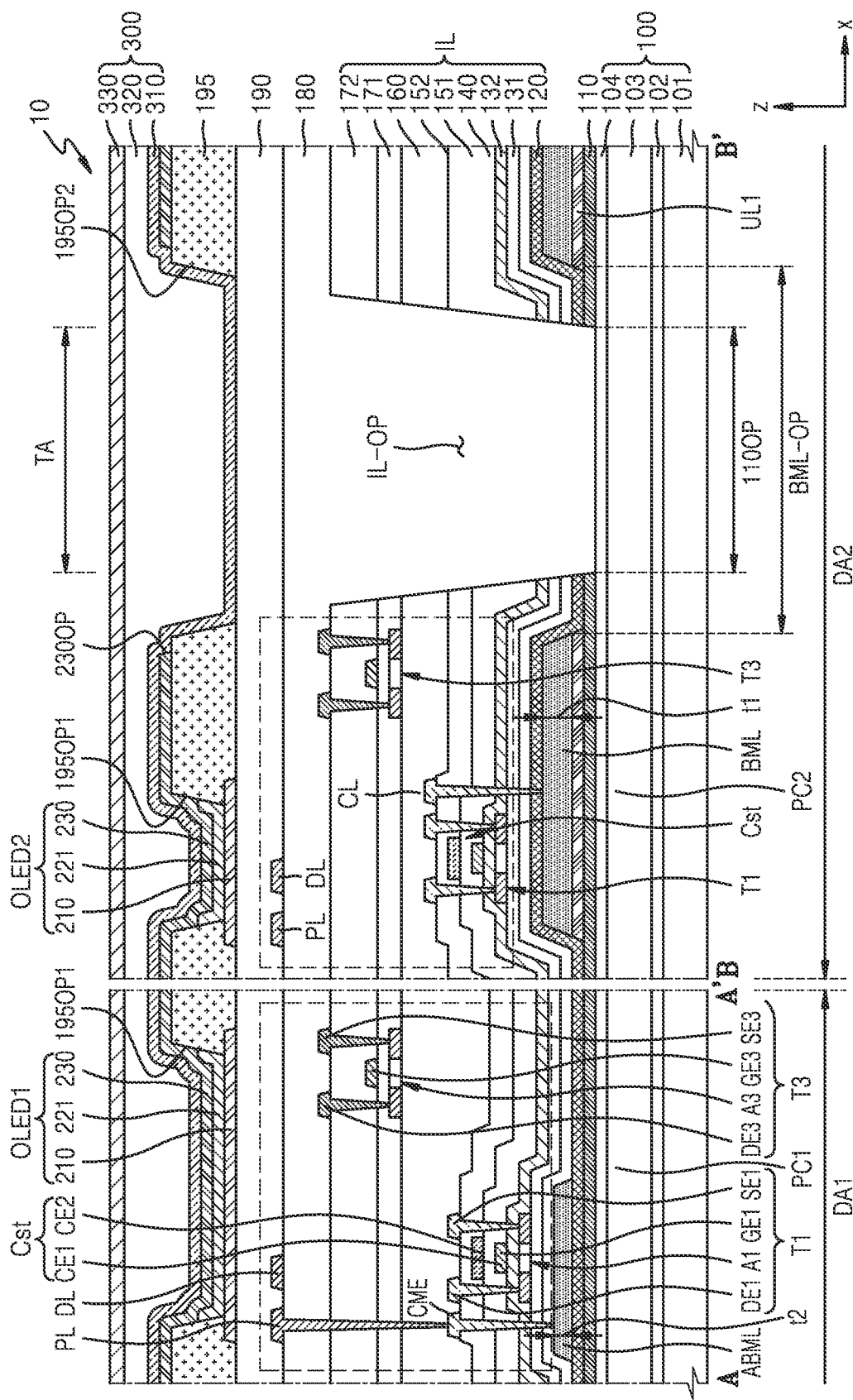
FIG. 11 is a cross-sectional view of a display panel in FIG. 9 taken along lines A-A' and B-B' in FIG. 9, according to another embodiment.

Referring to FIG. 11, the bottom metal layer BML arranged in the second display area DA2 may be arranged above the protective layer 110 with respect to the first lower layer UL1 therebetween. For example, an upper surface of the first lower layer UL1 may come into direct contact with the bottom metal layer BML, and a lower surface of the first lower layer UL1 may come into direct contact with the protective layer 110.

The protective layer 110 may include an a-Si layer, a Si-rich SiON layer, or an alternate stack structure of a SiON layer and a silicon nitride layer (for example, a structure in which the SiON layer and the silicon nitride layer are alternately stacked about 10 times or more). When light entering a component (see FIG. 3) located in the second display area DA2 and/or light emitted from the component (see FIG. 3) is reflected on the bottom metal layer BML and enters the component again, a noise may be caused. Materials of the protective layer 110 may prevent or minimize the introduction of light emitted from the component (see FIG. 3) to the bottom metal layer BML (though there is a difference according to a wavelength), and even when the corresponding light is reflected on the bottom metal layer BML, may prevent or minimize the transmission of light passing through the bottom metal layer BML toward the component (see FIG. 3).

Other features than the features relating to positions of the bottom metal layer BML, the first lower layer UL1, and the additional metal layer ABML are as described above with reference to FIG. 10, and redundant descriptions thereof will be omitted.

According to one or more embodiments, components such as a substrate may be prevented from being damaged by a laser beam used in a manufacturing process of a display panel, thus ensuring a sufficient transmittance of a transmittance in which the components are arranged. However, these objectives are examples and do not limit the scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate including a polymer resin;
a first pixel circuit and a second pixel circuit arranged on the substrate and each including a thin-film transistor;
a first light-emitting diode electrically connected to the first pixel circuit and located in a first display area;
a second light-emitting diode electrically connected to the second pixel circuit and located in a sub-display area of a second display area;
a bottom metal layer located in the second display area and disposed between the substrate and the second pixel circuit; and
a protective layer disposed in the first display area and the second display area, a portion of the protective layer corresponding to the second display area disposed between the substrate and the bottom metal layer,
wherein a first opening of the bottom metal layer is defined in a transmissive area that is adjacent to the sub-display area of the second display area, and a second opening of the protective layer is defined in the transmissive area and overlaps the first opening of the bottom metal layer.

2. The display panel of claim 1, wherein a width of the second opening of the protective layer is less than a width of the first opening of the bottom metal layer.

3. The display panel of claim 1, wherein the protective layer includes amorphous silicon, a silicon (Si)-rich silicon oxynitride, or a multi-layer structure of silicon oxide and silicon nitride.

4. The display panel of claim 1, wherein the thin-film transistor of each of the first pixel circuit and the second pixel circuit includes a semiconductor layer including polysilicon.

5. The display panel of claim 1, wherein the second pixel circuit includes a plurality of thin-film transistors, and
the bottom metal layer overlaps the plurality of thin-film transistors.

6. The display panel of claim 1, further comprising an additional metal layer disposed between the substrate and the first pixel circuit, wherein the additional metal layer overlaps one or some of a plurality of thin-film transistors of the first pixel circuit.

7. The display panel of claim 6, wherein a thickness of the additional metal layer is less than a thickness of the bottom metal layer.

8. The display panel of claim 6, further comprising an interlayer insulating layer disposed between the additional metal layer and the bottom metal layer.

9. The display panel of claim 1, further comprising a stacked body of inorganic insulating layers arranged on the substrate and arranged below the first light-emitting diode and the second light-emitting diode,
wherein a third opening is defined in the stacked body, which is located in the transmissive area, and overlaps the first opening of the bottom metal layer and the second opening of the protective layer.

10. The display panel of claim 9, further comprising an organic insulating layer arranged on the stacked body and arranged below the first light-emitting diode and the second light-emitting diode,
wherein a portion of the organic insulating layer is disposed in the third opening of the stacked body.

11. The display panel of claim 10, wherein the portion of the organic insulating layer is disposed in the second opening of the protective layer.

12. The display panel of claim 10, wherein the portion of the organic insulating layer comes into direct contact with the substrate through the second opening of the protective layer and the third opening of the stacked body.

13. The display panel of claim 12, wherein the substrate includes:
a first base layer including a polymer resin;
a first barrier layer arranged on the first base layer and including an inorganic insulating material;
a second base layer arranged on the first barrier layer and including a polymer resin; and
a second barrier layer arranged on the second base layer and including an inorganic insulating material, and
wherein the portion of the organic insulating layer comes into direct contact with the second barrier layer.

14. An electronic apparatus comprising:
a display panel including a first area and a second area at least partially surrounded by the first area, the second area including a sub-display area and a transmissive area; and a component arranged below the display panel to be located in the second display area, wherein the display panel further includes:

a substrate;

a first light-emitting diode arranged in the first display area and electrically connected to a first pixel circuit arranged on the substrate, the first pixel circuit including a thin-film transistor;

a second light-emitting diode arranged in the sub-display area of the second display area and electrically connected to a second pixel circuit arranged on the substrate, the second pixel circuit including a thin-film transistor;

a bottom metal layer disposed between the substrate and the second pixel circuit in the second display area, and having a first opening defined in the transmission area; and a protective layer disposed between the substrate and the bottom metal layer and having a second opening overlapping the first opening of the bottom metal layer.

15. The electronic apparatus of claim 14, wherein the display panel further includes a stacked body of inorganic insulating materials arranged on the bottom metal layer, wherein a third opening is defined in the stacked body and overlaps the first opening of the bottom metal layer and the second opening of the protective layer.

16. The electronic apparatus of claim 15, wherein the display panel further includes an organic insulating layer arranged on the stacked body and arranged below the first light-emitting diode and the second light-emitting diode, wherein a portion of the organic insulating layer is disposed in the third opening of the stacked body and the second opening of the protective layer.

17. The electronic apparatus of claim 16, wherein the portion of the organic insulating layer comes into direct contact with the substrate through the third opening of the stacked body and the second opening of the protective layer.

18. The electronic apparatus of claim 17, wherein the substrate includes:

a first base layer including a polymer resin;

a first barrier layer arranged on the first base layer and including an inorganic insulating material;

a second base layer arranged on the first barrier layer and including a polymer resin; and a second barrier layer arranged on the second base layer and including an inorganic insulating material, and wherein the portion of the organic insulating layer comes into direct contact with the second barrier layer.

19. The electronic apparatus of claim 14, wherein a width of the second opening of the protective layer is less than a width of the first opening of the bottom metal layer.

20. The electronic apparatus of claim 14, wherein the protective layer includes a material having a transmittance in a wavelength band of about 250 nm to about 350 nm, about 10% or less.

21. The electronic apparatus of claim 14, wherein the protective layer includes amorphous silicon, a silicon (Si)-rich silicon oxynitride, or a multi-layer structure of silicon oxide and silicon nitride.

22. The electronic apparatus of claim 14, wherein the thin-film transistor of each of the first pixel circuit and the second pixel circuit includes a semiconductor layer including polysilicon.

23. The electronic apparatus of claim 14, wherein the second pixel circuit includes a plurality of thin-film transistors, and the bottom metal layer overlaps the plurality of thin-film transistors.

24. The electronic apparatus of claim 14, wherein the display panel further includes an additional metal layer disposed between the substrate and the first pixel circuit.

25. The electronic apparatus of claim 24, wherein a thickness of the additional metal layer is less than a thickness of the bottom metal layer.

26. The electronic apparatus of claim 24, wherein the additional metal layer overlaps one or some of a plurality of thin-film transistors of the first pixel circuit.

27. The electronic apparatus of claim 24, wherein the display panel further includes an interlayer insulating layer disposed between the additional metal layer and the bottom metal layer.

28. The electronic apparatus of claim 14, wherein the component includes a sensor or a camera.

* * * * *